United States Patent
Park et al.

(10) Patent No.: US 11,942,032 B2
(45) Date of Patent: Mar. 26, 2024

(54) DISPLAY APPARATUS INCLUDING POWER LINE COMPRISING FIRST POWER LINE IN FIRST DIRECTION AND SECOND POWER LINE IN SECOND DIRECTION

(71) Applicant: SAMSUNG DISPLAY CO., LTD., Yongin-si (KR)

(72) Inventors: Junhyun Park, Yongin-si (KR); Dongwoo Kim, Yongin-si (KR); Sungjae Moon, Yongin-si (KR); Kangmoon Jo, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/547,560

(22) Filed: Dec. 10, 2021

(65) Prior Publication Data

US 2022/0101792 A1   Mar. 31, 2022

Related U.S. Application Data

(63) Continuation of application No. 16/589,718, filed on Oct. 1, 2019, now Pat. No. 11,227,545.

(30) Foreign Application Priority Data

Oct. 8, 2018   (KR) ........................ 10-2018-0119747

(51) Int. Cl.
   *G06F 3/038*   (2013.01)
   *G09G 3/20*    (2006.01)
   (Continued)

(52) U.S. Cl.
   CPC ......... *G09G 3/3233* (2013.01); *G09G 3/2085* (2013.01); *G09G 3/3266* (2013.01);
   (Continued)

(58) Field of Classification Search
   CPC .. G09G 3/3233; G09G 3/2085; G09G 3/3266; G09G 3/3275
   (Continued)

(56) References Cited

U.S. PATENT DOCUMENTS

| | | | |
|---|---|---|---|
| 9,947,269 | B2 | 4/2018 | Jung et al. |
| 2003/0146693 | A1 | 8/2003 | Ishihara et al. |

(Continued)

FOREIGN PATENT DOCUMENTS

| | | |
|---|---|---|
| JP | 2017173505 A | 9/2017 |
| KR | 20030067547 A | 8/2003 |

(Continued)

*Primary Examiner* — Jonathan M Blancha
(74) *Attorney, Agent, or Firm* — CANTOR COLBURN LLP

(57) ABSTRACT

A display apparatus includes a first transistor including a semiconductor layer, a first electrode and a second electrode, the first electrode and the second electrode respectively electrically connected to a source area and a drain area of the semiconductor layer, and a first gate electrode and a second gate electrode corresponding to a channel area of the semiconductor layer and facing each other, and a capacitor including a first capacitor electrode, a second capacitor electrode above the first capacitor electrode, and a third capacitor electrode below the first capacitor electrode.

18 Claims, 16 Drawing Sheets

(51) Int. Cl.
   *G09G 3/3233* (2016.01)
   *G09G 3/3266* (2016.01)
   *G09G 3/3275* (2016.01)
   *G09G 3/36* (2006.01)

(52) U.S. Cl.
   CPC ......... *G09G 3/3275* (2013.01); *G09G 3/3655* (2013.01); *G09G 3/3677* (2013.01); *G09G 3/3688* (2013.01)

(58) Field of Classification Search
   USPC ........................................................ 345/204
   See application file for complete search history.

(56) References Cited

U.S. PATENT DOCUMENTS

| | | | | |
|---|---|---|---|---|
| 2005/0179374 | A1* | 8/2005 | Kwak | H01L 51/5228 |
| | | | | 313/506 |
| 2010/0277400 | A1* | 11/2010 | Jeong | G09G 3/3275 |
| | | | | 345/76 |
| 2012/0097940 | A1* | 4/2012 | Kwon | G02F 1/136213 |
| | | | | 438/34 |
| 2012/0313923 | A1 | 12/2012 | Minami et al. | |
| 2013/0207117 | A1* | 8/2013 | An | H01L 27/3276 |
| | | | | 257/40 |
| 2015/0379923 | A1* | 12/2015 | Lee | H01L 27/3272 |
| | | | | 345/82 |
| 2016/0093647 | A1* | 3/2016 | Kim | G02F 1/136227 |
| | | | | 257/40 |
| 2016/0118457 | A1 | 4/2016 | Kim | |
| 2016/0370621 | A1 | 12/2016 | Huang | |
| 2017/0186831 | A1* | 6/2017 | Nam | H01L 27/3272 |
| 2017/0278916 | A1 | 9/2017 | Maruyama | |
| 2017/0294464 | A1 | 10/2017 | Kwon | |
| 2017/0294498 | A1 | 10/2017 | Kwon | |
| 2018/0061314 | A1 | 3/2018 | Kim | |
| 2018/0124933 | A1* | 5/2018 | Park | H01L 27/32 |
| 2018/0145123 | A1 | 5/2018 | Kim et al. | |
| 2018/0204895 | A1* | 7/2018 | Lin | G09G 3/3258 |

FOREIGN PATENT DOCUMENTS

| | | |
|---|---|---|
| KR | 1020050081540 A | 8/2005 |
| KR | 1020160047133 A | 5/2016 |
| KR | 1020170078075 A | 7/2017 |
| KR | 1020170115640 A | 10/2017 |
| KR | 1020170115641 A | 10/2017 |
| KR | 101801354 B1 | 11/2017 |
| KR | 1020170129508 A | 11/2017 |
| KR | 1020180024910 A | 3/2018 |
| KR | 1020180057764 A | 5/2018 |

* cited by examiner

DISPLAY APPARATUS INCLUDING POWER LINE COMPRISING FIRST POWER LINE IN FIRST DIRECTION AND SECOND POWER LINE IN SECOND DIRECTION

This application is a continuation of U.S. patent application Ser. No. 16/589,718, filed on Oct. 1, 2019, which claims priority to Korean Patent Application No. 10-2018-0119747, filed on Oct. 8, 2018, and all the benefits accruing therefrom under 35 U.S.C. § 119, the content of which in its entirety is herein incorporated by reference.

BACKGROUND

1. Field

Exemplary embodiments relate to a display apparatus, and more particularly, to a display apparatus including a double-gate transistor.

2. Description of the Related Art

Display apparatuses such as organic light-emitting display apparatuses, liquid crystal display apparatuses, or the like include an array substrate including a thin-film transistor ("TFT"), a capacitor, and a plurality of wirings. An array substrate includes fine patterns such as the TFT, the capacitor, and the plurality of wirings, and a display apparatus is operated via complex connection between the TFT, the capacitor, and the plurality of wirings.

Recently, as a demand for compact display apparatuses having a high resolution has been increasing, a demand for efficient spatial arrangements, connection structures, and driving methods of TFTs, capacitors, and wirings included in display apparatuses, and for an improvement in image quality realized by such display apparatuses has been also increasing.

SUMMARY

Exemplary embodiments include a display apparatus, in which characteristics of transistors may be improved and a capacitor's capacity may be ensured.

Additional exemplary embodiments will be set forth in part in the description which follows and, in part, will be apparent from the description, or may be learned by practice of the presented embodiments.

In an exemplary embodiment, a display apparatus includes a first transistor including a semiconductor layer, a first electrode and a second electrode, the first electrode and the second electrode respectively electrically connected to a source area and a drain area of the semiconductor layer, and a first gate electrode and a second gate electrode corresponding to a channel area of the semiconductor layer and facing each other, and a capacitor including a first capacitor electrode, a second capacitor electrode above the first capacitor electrode, and a third capacitor electrode below the first capacitor electrode, where the first gate electrode of the first transistor is electrically connected to one of the first electrode and the second electrode of the first transistor, and the one of the first electrode and the second electrode of the first transistor is electrically connected to the third capacitor electrode.

In an exemplary embodiment, the second capacitor electrode and the third capacitor electrode of the capacitor may be electrically connected to each other.

In an exemplary embodiment, the one of the first electrode and the second electrode of the first transistor and the second capacitor electrode of the capacitor may be electrically connected to a pixel electrode.

In an exemplary embodiment, the display apparatus may further include a connection electrode electrically connected to the one of the first electrode and the second electrode of the first transistor and to the second capacitor electrode of the capacitor, where the pixel electrode is electrically connected to the connection electrode.

In an exemplary embodiment, the first gate electrode of the first transistor may extend from the third capacitor electrode of the capacitor.

In an exemplary embodiment, the second gate electrode of the first transistor may extend from the first capacitor electrode of the capacitor.

In an exemplary embodiment, the one of the first electrode and the second electrode of the first transistor may extend from the second capacitor electrode of the capacitor.

In an exemplary embodiment, the first gate electrode of the first transistor and the third capacitor electrode of the capacitor may be disposed in a same layer, and the second gate electrode of the first transistor and the first capacitor electrode of the capacitor may be disposed in a same layer, and the first electrode and the second electrode of the first transistor and the second capacitor electrode of the capacitor may be disposed in a same layer.

In an exemplary embodiment, the display apparatus may further include a second transistor connected between the second gate electrode of the first transistor and a data line.

In an exemplary embodiment, the display apparatus may further include a third transistor connected between the one of the first electrode and the second electrode of the first transistor and a sensing line.

In an exemplary embodiment, the display apparatus may further include a light-emitting device connected to the first transistor, where the light-emitting device includes a pixel electrode connected to the one of the first electrode and the second electrode of the first transistor, an opposite electrode facing the pixel electrode, and an emissive layer between the pixel electrode and the opposite electrode.

In an exemplary embodiment, the display apparatus may further include a power line electrically connected to the opposite electrode and disposed adjacent to the first transistor.

In an exemplary embodiment, a display apparatus includes a first power line, a second power line, and a pixel including a first transistor and a capacitor that are electrically connected to the first power line, and a light-emitting device electrically connected to the second power line, where the first transistor includes a semiconductor layer, a first electrode and a second electrode respectively electrically connected to a source area and a drain area of the semiconductor layer, and a first gate electrode and a second gate electrode corresponding to a channel area of the semiconductor layer and facing each other, where the first gate electrode of the first transistor is electrically connected to one of the first electrode and the second electrode of the first transistor, where the first power line includes a 1-1 power line extending in a first direction and a 1-2 power line extending in a second direction different from the first direction and electrically connected to the 1-1 power line, where the second power line includes a 2-1 power line extending in the first direction and a 2-2 power line extending in the second direction and electrically connected to the 2-1 power line.

In an exemplary embodiment, one of the 1-2 power line of the first power line and the 2-2 power line of the second power line may be disposed in each of a plurality of rows, where the 1-2 power line and the 2-2 power line are alternately disposed in the first direction.

In an exemplary embodiment, the capacitor may include a first capacitor electrode, a second capacitor electrode above the first capacitor electrode, and a third capacitor electrode below the first capacitor electrode, and the one of the first electrode and the second electrode of the first transistor may be electrically connected to the third capacitor electrode.

In an exemplary embodiment, the 1-2 power line of the first power line and the 2-2 power line of the second power line may be disposed in each of a plurality of rows.

In an exemplary embodiment, the second capacitor electrode and the third capacitor electrode of the capacitor may be electrically connected to each other.

In an exemplary embodiment, the light-emitting device may include a pixel electrode connected to the one of the first electrode and the second electrode of the first transistor, an opposite electrode facing the pixel electrode, and an emissive layer between the pixel electrode and the opposite electrode, where the second power line is electrically connected to the opposite electrode.

In an exemplary embodiment, the one of the first electrode and the second electrode of the first transistor and the second capacitor electrode of the capacitor may be electrically connected to the pixel electrode.

In an exemplary embodiment, the display apparatus may further include a connection electrode electrically connected to the one of the first electrode and the second electrode of the first transistor and to the second capacitor electrode of the capacitor, where the pixel electrode is electrically connected to the connection electrode.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
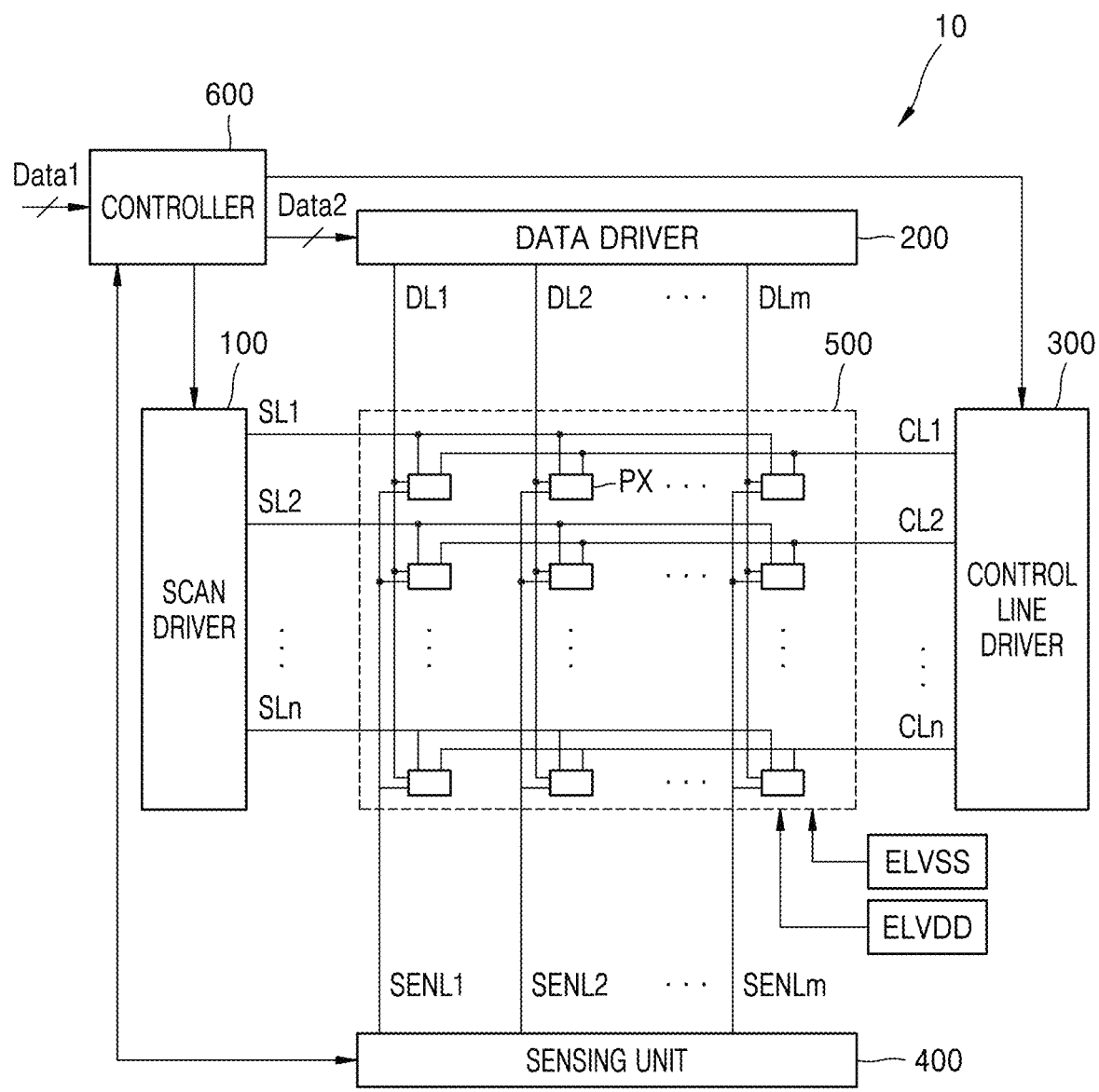
FIG. 1 is a schematic view illustrating an exemplary embodiment of a structure of a display apparatus.

Reference will now be made in detail to embodiments, examples of which are illustrated in the accompanying drawings, where like reference numerals refer to like elements throughout. In this regard, the illustrated exemplary embodiments may have different forms and should not be construed as being limited to the descriptions set forth herein. Accordingly, the exemplary embodiments are merely described below, by referring to the drawing figures, to explain exemplary embodiments of the description. As used herein, the term "and/or" includes any and all combinations of one or more of the associated listed items. Expressions such as "at least one of," when preceding a list of elements, modify the entire list of elements and do not modify the individual elements of the list.

Since the disclosure may have various modifications and several embodiments, embodiments are shown in the drawings and will be described in detail. Effects, features, and a method of achieving the same will be specified with reference to the exemplary embodiments described below in detail together with the attached drawings. However, the exemplary embodiments may have different forms and should not be construed as being limited to the descriptions set forth herein.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the exemplary embodiments below, it will be further understood that the terms "comprise" and/or "have" used herein specify the presence of stated features or components, but do not preclude the presence or addition of one or more other features or components.

In the exemplary embodiments below, it will be understood when a portion such as a layer, an area, or an element is referred to as being "on" or "above" another portion, it can be directly on or above the other portion, or intervening portion may also be present.

Sizes of components in the drawings may be exaggerated or contracted for convenience of explanation. For example, since sizes and thicknesses of components in the drawings are arbitrarily illustrated for convenience of explanation, the following embodiments are not limited thereto.

As used herein, the terms "corresponding" or "correspondingly" may indicate that elements are arranged in or connected to the same column or row, depending on the context. For example, when a first member is connected to a corresponding second member from among a plurality of second members, it means that the first member is connected to a second member that is arranged in the same column or the same row as the first member.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, the invention will be described more fully with reference to the accompanying drawings, in which exemplary embodiments of the invention are shown. In the drawings, like elements are labeled like reference numerals and repeated description thereof will be omitted.

FIG. 1 is a schematic view illustrating an exemplary embodiment of a structure of a display apparatus 10.

Referring to FIG. 1, the exemplary embodiment of the display apparatus 10 may include a scan driver 100, a data driver 200, a control line driver 300, a sensing unit 400, a pixel unit 500, and a controller 600.

The scan driver 100 may generate a scan signal in accordance with the control by the controller 600, and supply scan signals to scan lines SL1 through SLn where n is a natural number. The scan driver 100 may sequentially supply a scan signal to the scan lines SL1 through SLn. When a scan signal is sequentially supplied to the scan lines SL1 through SLn, pixels PX may be selected in units of horizontal lines (rows). A scan signal may be set as a gate on voltage at which a transistor included in pixels PX may be turned on.

The data driver 200 may generate a data signal in accordance with second data Data2 supplied from the controller 600, and supply the data signal to data lines DL1 through DLm where m is a natural number. The data signal supplied to the data lines DL1 through DLm may be supplied to pixels PX selected via the scan signal. The pixels PX may emit light of a predetermined brightness in accordance with the data signal, and a certain image is displayed on the pixel unit 500.

The second data Data2 is a value based on first data Data1 input from the outside in accordance with an image to be displayed by the pixel unit 500, and may be particularly set to a value obtained by modifying the first data Data1 to compensate for a deviation of a driving transistor included in each of the pixels PX.

The control line driver 300 supplies a control signal to the control lines CL1 through CLn in accordance with the control by the controller 600. The control line driver 300 may sequentially supply a control signal to the control lines CL1 through CLn during a period in which characteristic information of each pixel PX is sensed (sensing period). A control signal may be set as a gate on voltage at which a transistor included in the pixels PX may be turned on. The pixels PX that have received a control signal may be electrically connected to sensing lines SENL1 through SENLm.

In another exemplary embodiment of the invention, the control line driver 300 may not be necessarily included. In an exemplary embodiment, instead of the control line driver 300, the scan driver 100 may supply a control signal to the control lines CL1 through CLn, for example. In addition, instead of forming additional control lines CL1 through CLn, electrical connection between the pixels PX and the sensing lines SENL1 through SENLm may be controlled by the scan lines SL1 through SLn during the sensing period.

The sensing unit 400 may be connected to the sensing lines SENL1 through SENLm. The sensing unit 400 may sense deviation information of each of the sensing lines SENL1 through SENLm (that is, deviation information of channels). In an exemplary embodiment, the sensing unit 400 may sense, as deviation information of each channel, a capacity of a parasitic capacitor provided in each of the sensing lines SENL1 through SENLm, for example. The sensing unit 400 may generate sensing data indicating characteristic information of each of the pixels PX by the sensed deviation information of channels. Characteristic information may include threshold voltage information of a driving transistor of each pixel PX, mobility information of the driving transistor, and/or deterioration information of an organic light-emitting diode.

A plurality of pixels PX may be arranged in the pixel unit 500. Each pixel PX may be connected to a corresponding scan line from among the plurality of scan lines SL1 through SLn, a corresponding control line from among the plurality of control lines CL1 through CLn, a corresponding sensing line from among the plurality of sensing lines SENL1 through SENLm, and a corresponding data line from among the plurality of data lines DL1 through DLm. The pixel unit 500 may be set as a display area displaying an image. Each pixel PX may receive a first power voltage ELVDD and a second power voltage ELVSS. The first power voltage ELVDD and the second power voltage ELVSS may be different from each other. The second power voltage ELVSS may be lower than the first power voltage ELVDD. In an exemplary embodiment, the first power voltage ELVDD may be a positive voltage, and the second power voltage ELVSS may be a negative voltage or a ground voltage, for example. In the specification, a pixel PX mainly refers to one sub-pixel. However, the invention is not limited thereto, and a pixel PX may also refer to one unit pixel including a plurality of sub-pixels. That is, a pixel PX described in the specification may be interpreted as one sub-pixel or as a plurality of sub-pixels constituting one unit pixel. A sub-pixel may include a light-emitting device and a pixel circuit electrically connected to the light-emitting device.

The controller 600 may control the scan driver 100, the data driver 200, the control line driver 300, and the sensing unit 400. By sensing data from the sensing unit 400, the controller 600 may convert first data Data1 to second data Data2, in which characteristic deviation is compensated for.

The scan driver 100, the data driver 200, the control line driver 300, the sensing unit 400, and/or the controller 600 may be directly disposed on a substrate with the pixel unit 500, or may be connected to the pixel unit 500 via an additional component (e.g., a circuit board). In another exemplary embodiment, some of the scan driver 100, the data driver 200, the control line driver 300, the sensing unit 400, and the controller 600 may be directly disposed on a substrate with the pixel unit 500, and the others may be connected to the pixel unit 500 via an additional component (e.g., a circuit board).

Figure 2:
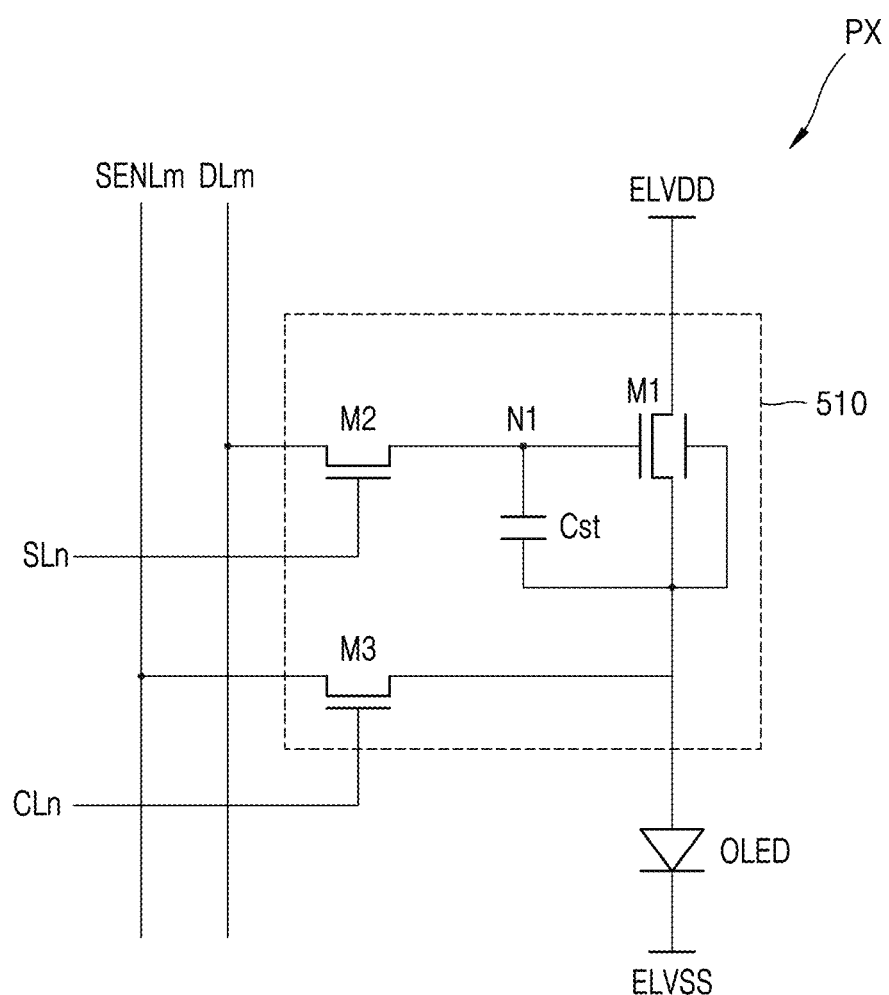
FIG. 2 illustrates an example of a pixel illustrated in FIG. 1.

FIG. 2 illustrates an example of the pixel PX illustrated in FIG. 1. In FIG. 2, for convenience of description, a pixel PX connected to an mth data line DLm and an nth scan line SLn will be described as an example.

Referring to FIG. 2, the exemplary embodiment of the pixel PX may include a light-emitting device and a pixel circuit 510. The light-emitting device may be an organic light-emitting diode OLED.

A pixel electrode (anode electrode) of the organic light-emitting diode OLED may be connected to the pixel circuit 510, and an opposite electrode (cathode electrode) of the organic light-emitting diode OLED may be connected to the second power voltage ELVSS. The organic light-emitting diode OLED may emit light at a brightness corresponding to a current amount supplied from the pixel circuit 510.

The pixel circuit 510 may control a current amount that flows from the first power voltage ELVDD to the second power voltage ELVSS by passing by the organic light-emitting diode OLED, in accordance with a data signal. The pixel circuit 510 may include a first transistor M1, a second transistor M2, a third transistor M3, and a capacitor Cst.

At least one of the first transistor M1 through the third transistor M3 may be an oxide semiconductor thin film transistor ("TFT") including an active layer including an oxide semiconductor. At least one of the first transistor M1 through the third transistor M3 may be a silicon semiconductor TFT including an active layer including polysilicon. Depending on a transistor type, a first electrode may be one of a source electrode and a drain electrode, and a second electrode may be the other of the source electrode and the drain electrode.

A first electrode of the first transistor M1 may be connected to the first power voltage ELVDD, and a second electrode of the first transistor M1 may be connected to a pixel electrode of the organic light-emitting diode OLED. The first transistor M1 may be a double-gate transistor having two gate electrodes. A first gate electrode and a second gate electrode of the first transistor M1 may be located to face each other with an insulating layer therebetween. The first gate electrode of the first transistor M1 may shift a threshold voltage of the first transistor M1 in accordance with a voltage applied thereto. Accordingly, a variation in characteristics of the first transistor M1 may be compensated. The first gate electrode of the first transistor M1 may be connected to the second electrode of the first transistor M1. As a voltage applied to the second electrode of the first transistor M1 is applied to the first gate electrode of the first transistor M1, a current variation (inclination) is reduced in a saturation area of a voltage-current characteristic graph of the first transistor M1, thereby improving output saturation characteristics of the first transistor M1. The second gate electrode of the first transistor M1 may be connected to a first node N1. The first transistor M1 may be a driving transistor controlling a current amount that flows from the first power voltage ELVDD to the second power voltage ELVSS by passing by the organic light-emitting diode OLED, in accordance with a voltage of the first node N1.

A first electrode of the second transistor M2 may be connected to the data line DLm, and a second electrode of the second transistor M2 may be connected to the first node N1. A gate electrode of the second transistor M2 may be connected to the scan line SLn. The second transistor M2 may be turned on when a scan signal is supplied through the scan line SLn, thereby electrically connecting the data line DLm and the first node N1.

A first electrode of the third transistor M3 may be connected to the second electrode of the first transistor M1, and a second electrode of the third transistor M3 may be connected to the sensing line SENLm. A gate electrode of the third transistor M3 may be connected to the control line CLn. The third transistor M3 may be turned on when a control signal is supplied through the control line CLn, thereby electrically connecting the sensing line SENLm and the second electrode of the first transistor M1. The third transistor M3 may sense characteristic information of the first transistor M1.

The capacitor Cst may be connected between the first node N1 and the second electrode of the first transistor M1 and store a voltage of the first node N1. A first electrode of the capacitor Cst may be connected to the second gate electrode of the first transistor M1, and a second electrode of the capacitor Cst may be connected to the second electrode of the first transistor M1.

In FIG. 2, while the first through third transistors M1 through M3 are illustrated as a negative metal oxide semiconductor ('NMOS"), the invention is not limited thereto. In an exemplary embodiment, at least one of the first through third transistors M1 through M3 may be a positive metal oxide semiconductor ("PMOS"), for example.

Figure 3A:
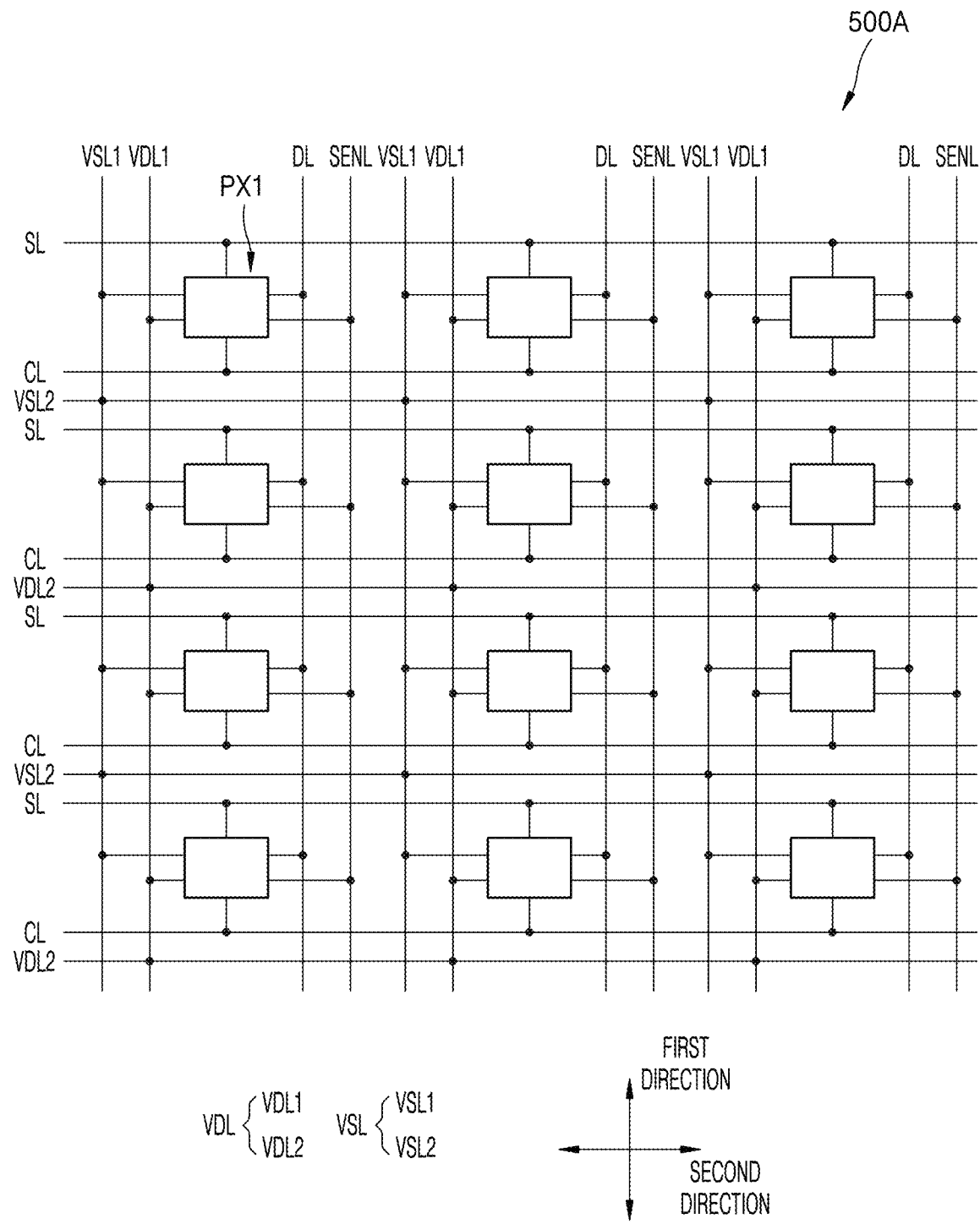
FIGS. 3A and 3B are schematic views illustrating an exemplary embodiment of a wiring arrangement of a pixel unit.
Figure 3B:
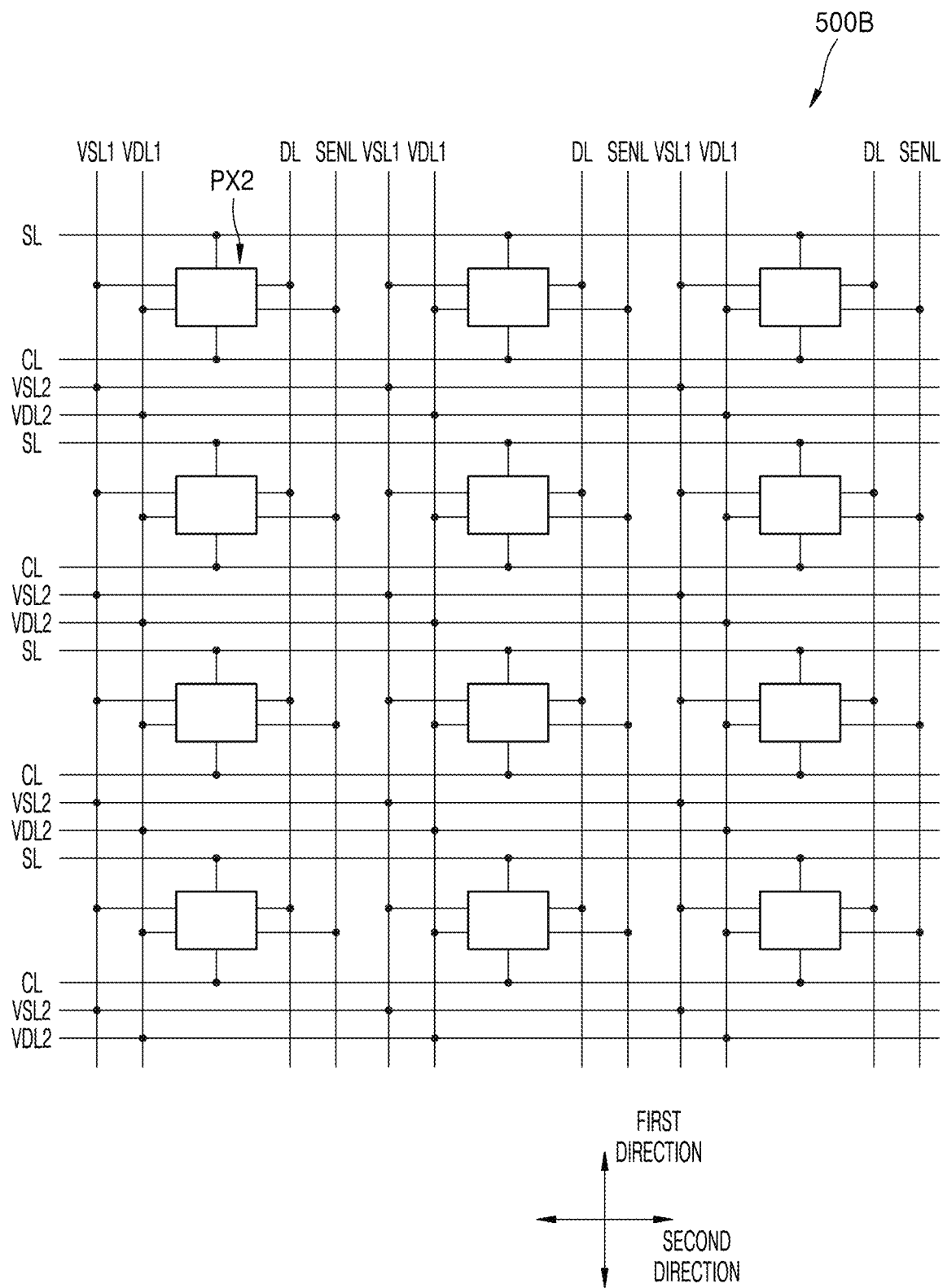

FIGS. 3A and 3B are schematic views illustrating an exemplary embodiment of a wiring arrangement of a pixel unit 500A and 500B.

Referring to FIG. 3A, in the exemplary embodiment of the pixel unit 500A, a plurality of pixels PX1 may be arranged in a first direction and a second direction, where the first direction crosses the second direction. The pixel PX1 may be connected to a scan line SL, a data line DL, a sensing line SENL, and a control line CL. The pixel PX1 may be connected to a first power line VDL and a second power line VSL.

The first power line VDL may include a 1-1 power line VDL1 extending in the first direction and a 1-2 power line VDL2 extending in the second direction and connected to the 1-1 power line VDL1. The second power line VSL may include a 2-1 power line VSL1 extending in the first direction and a 2-2 power line VSL2 extending in the second direction and connected to the 2-1 power line VSL1.

The 1-1 power line VDL1 and the 2-1 power line VSL1 may be arranged in parallel on the left or right of the pixel PX. In FIG. 3A, the 1-1 power line VDL1 and the 2-1 power line VSL1 are arranged in parallel on the left side of the pixel PX1. The 2-1 power line VSL1 may be arranged on an outer portion with respect to the 1-1 power line VDL1. The 1-2 power line VDL2 and the 2-2 power line VSL2 may be alternately arranged in the first direction in units of rows. In an exemplary embodiment, pixels PX1 in odd-numbered rows may be connected to the 2-2 power line VSL2, and pixels PX1 in even-numbered rows may be connected to the 1-2 power line VDL2, for example. In an alternative exemplary embodiment, pixels PX1 in even-numbered rows may be connected to the 2-2 power line VSL2, and pixels PX1 in odd-numbered rows may be connected to the 1-2 power line VDL2.

The data line DL and the sensing line SENL may extend in the first direction. The data line DL and the sensing line SENL may be arranged in parallel on the right or left of the pixel PX. In FIG. 3A, for example, the data line DL and the sensing line SENL are arranged on the right of the pixel PX1. The sensing line SENL may be arranged on an outer portion with respect to the data line DL.

The scan line SL and the control line CL may extend in the second direction. The scan line SL may be arranged above the pixel PX1, and the control line CL may be arranged below the pixel PX1.

A plurality of pixels PX2 may be arranged in a pixel unit 500B illustrated in FIG. 3B. Each pixel PX2 may be connected to a scan line SL, a data line DL, a sensing line SENL, and a control line CL. A first power line VDL and a second power line VSL may be connected to the pixel PX2. FIG. 3B illustrates an example in which a 1-2 power line VDL2 and a 2-2 power line VSL2 are arranged in each row, and the other wiring arrangement is similar to that of FIG. 3A.

Figure 4A:
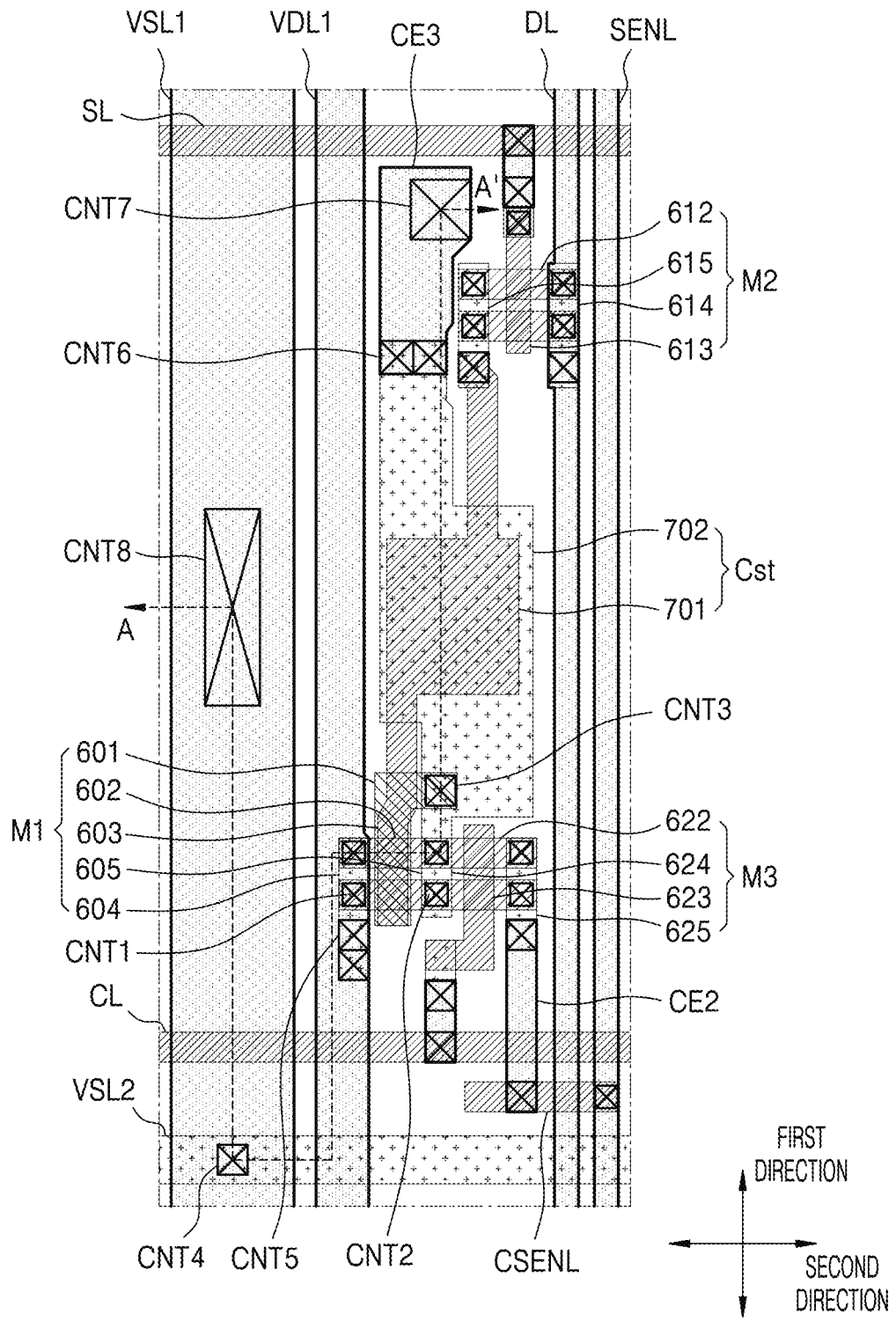
FIG. 4A is a plan view of an exemplary embodiment of a pixel illustrated in FIG. 3A.
Figure 4B:
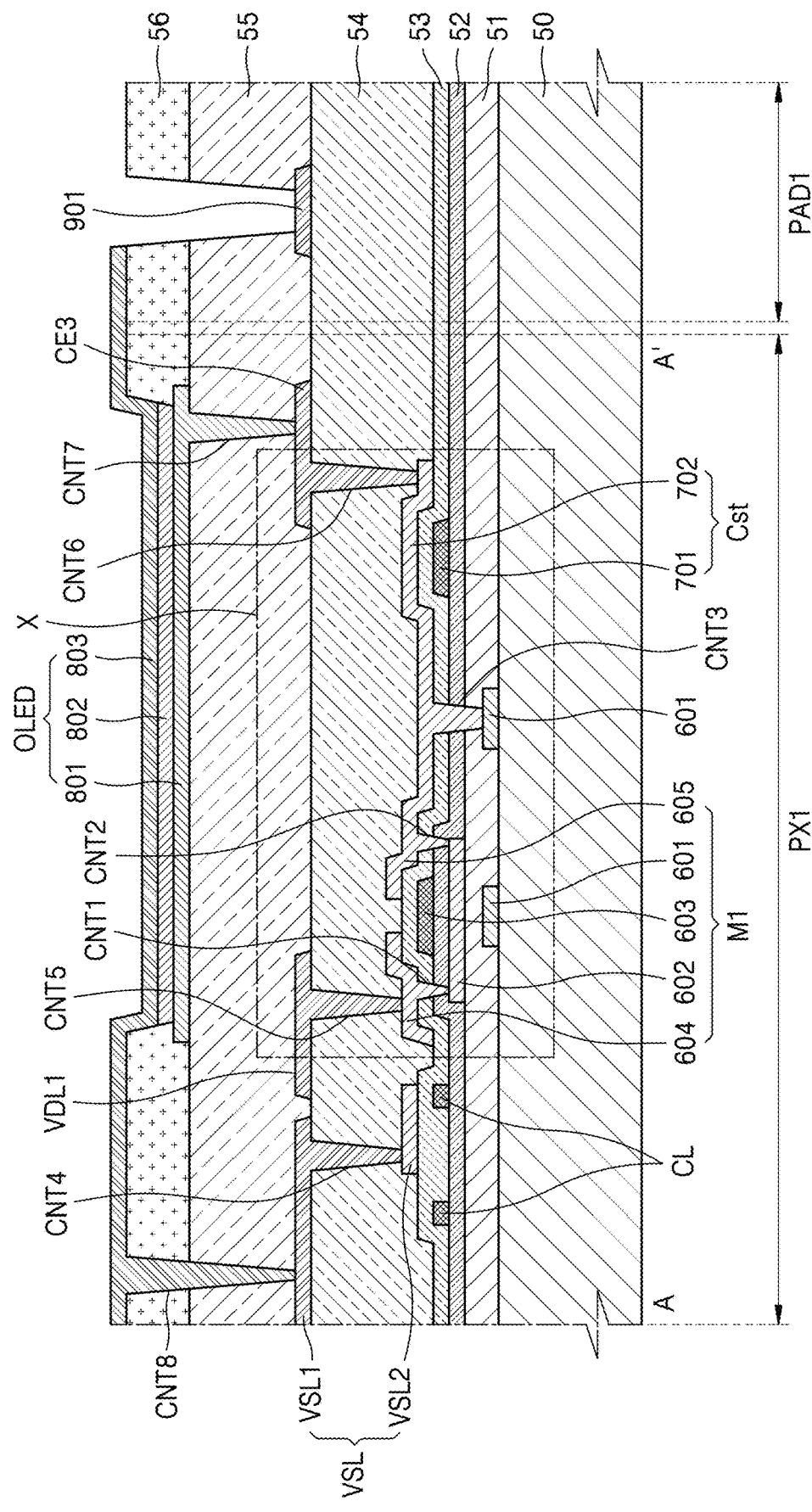
FIG. 4B is a cross-sectional view taken along line A-A' of FIG. 4A.
Figure 4C:
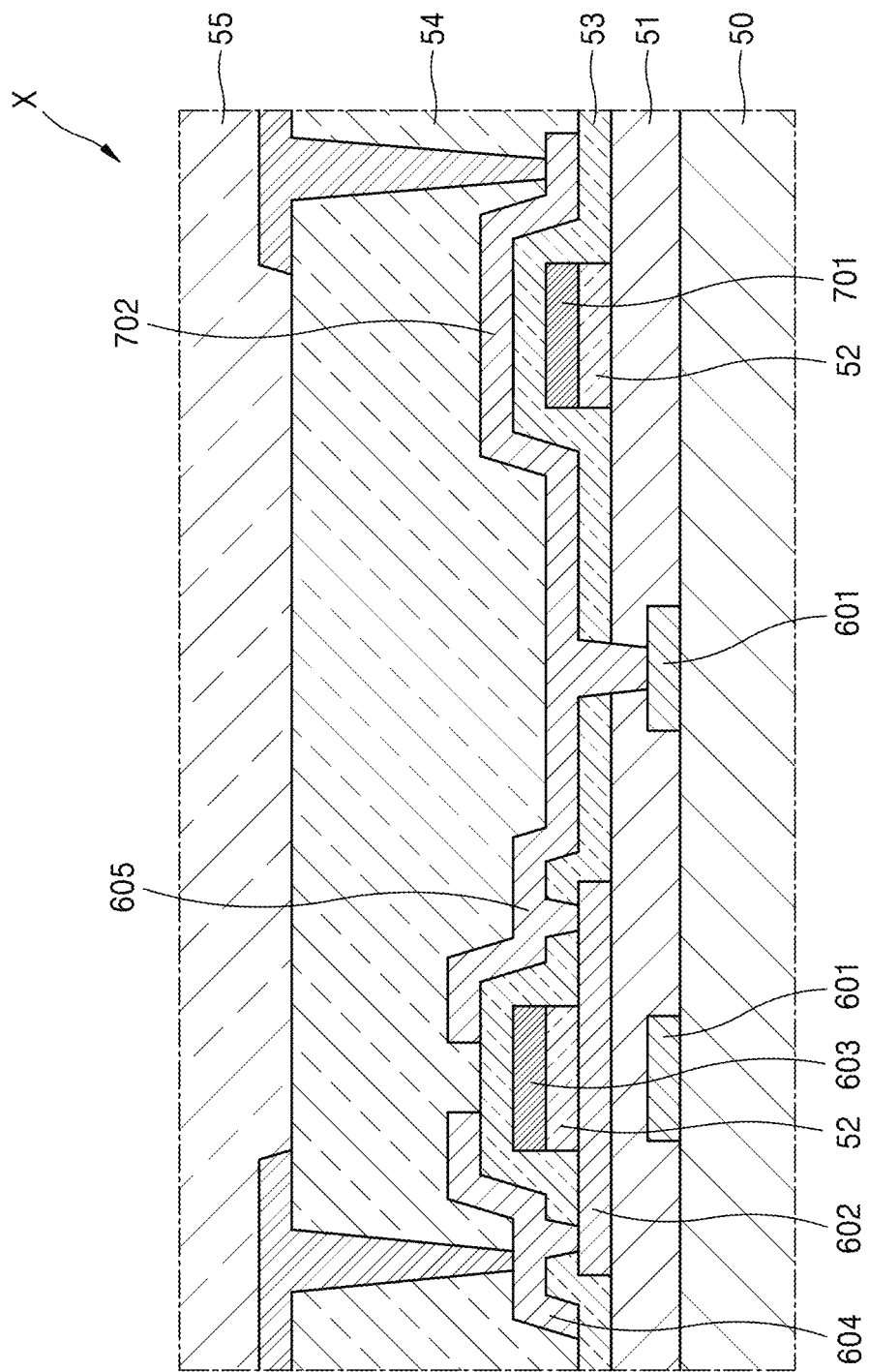
FIG. 4C is a cross-sectional view of portion X of FIG. 4B.
Figure 4D:
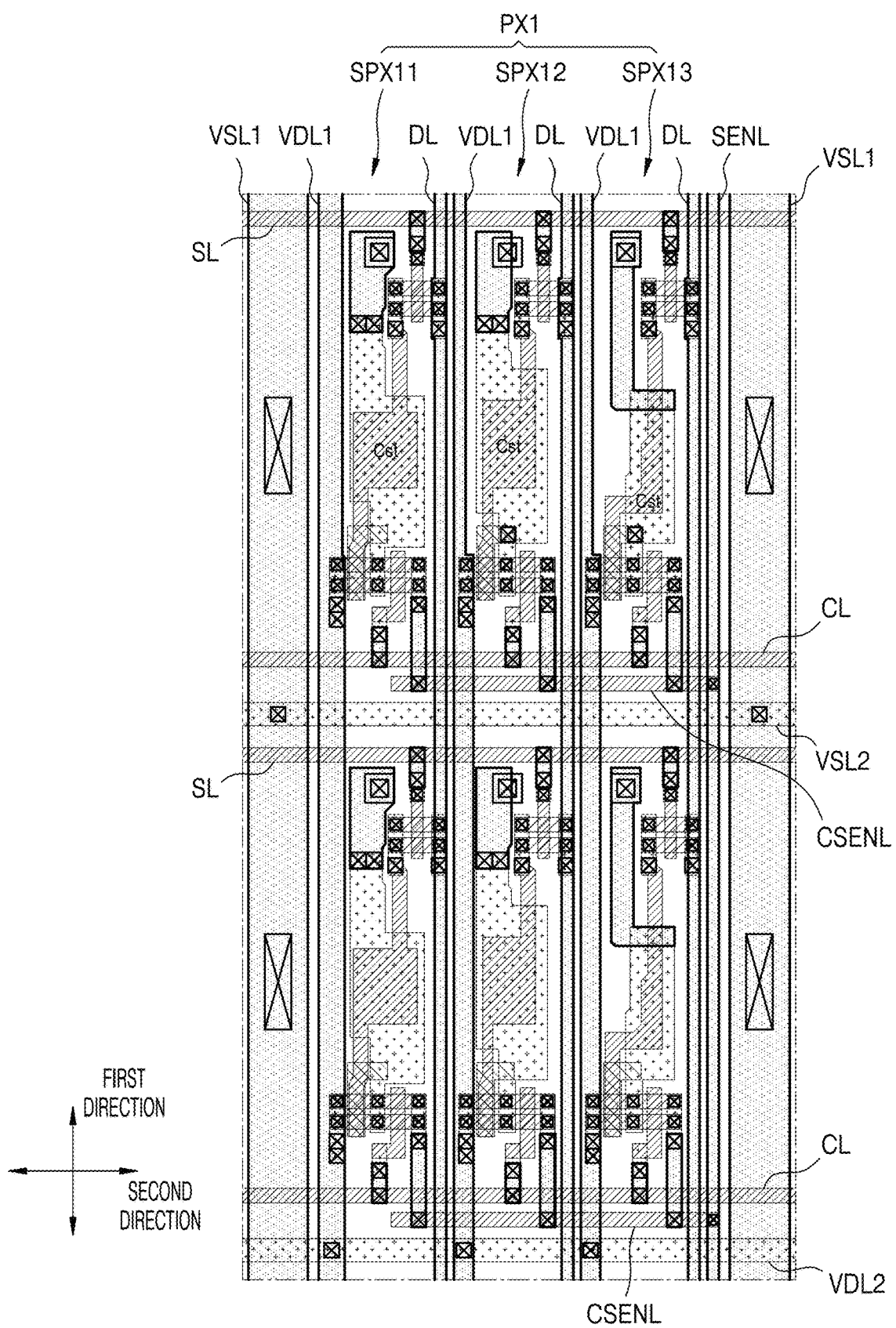
FIG. 4D is a plan view illustrating an exemplary embodiment of an arrangement of a unit pixel.

FIG. 4A is a plan view of an exemplary embodiment of the pixel PX1 illustrated in FIG. 3A. FIG. 4B is a cross-sectional view of the pixel PX1 taken along line A-A' of FIG. 4A. FIG. 4C is a cross-sectional view of a portion X of the pixel PX1 of FIG. 4B. FIG. 4D is a plan view illustrating an arrangement of a unit pixel. In FIG. 4B, a pad electrode 901 of a pad unit PAD is also illustrated.

Referring to FIGS. 4A and 4B, the exemplary embodiment of the pixel PX1 may include a pixel circuit including the first through third transistors M1 through M3 and a capacitor Cst, and an organic light-emitting diode OLED provided on a substrate 50. The first through third transistors M1 through M3 may each have a structure in which two transistors are connected in parallel. A conductive layer may be arranged on the substrate 50 and function as a bottom gate electrode of the first transistor M1.

The first transistor M1 may be a double-gate transistor. The first transistor M1 may include a first gate electrode 601 as a bottom gate electrode, a second gate electrode 603 as a top gate electrode, a semiconductor layer 602, a first electrode 604, and a second electrode 605. A first insulating layer 51 may be arranged between the first gate electrode 601 and the semiconductor layer 602. A second insulating layer 52 may be arranged between the semiconductor layer 602 and the second gate electrode 603. The first gate electrode 601 and the second gate electrode 603 may be disposed to correspond to a channel area between source and drain areas of the semiconductor layer 602.

A third insulating layer 53 may be arranged on the second gate electrode 603, and the first electrode 604 and the second electrode 605 may be arranged on the third insulating layer 53. A fourth insulating layer 54 may be arranged on the first electrode 604 and the second electrode 605. The first electrode 604 may contact and be electrically connected to one of the source area and the drain area of the semiconductor layer 602 via a contact hole CNT1, and the second electrode 605 may contact and be electrically connected to the other of the source area and the drain area of the semiconductor layer 602 via a contact hole CNT2. The second electrode 605 may contact and be electrically connected to the first gate electrode 601 through a contact hole CNT3. The first electrode 604 may contact and be electrically connected to the 1-1 power line VDL1 on the fourth insulating layer 54 via a contact hole CNT5. In the illustrated exemplary embodiment, the first gate electrode 601 to which a voltage is applied is provided, and thus, a back channel electric potential of the first transistor M1 may be maintained stably. The first gate electrode 601 may also function as a shielding layer. That is, the first gate electrode 601 may improve transistor characteristics while ensuring that the first transistor M1 is not affected by external light and/or voltage fluctuation of the surroundings.

The second transistor M2 may include a gate electrode 613, a semiconductor layer 612, a first electrode 614, and a second electrode 615. A second insulating layer 52 may be arranged between the semiconductor layer 612 and the gate electrode 613. The gate electrode 613 may be disposed to correspond to a channel area between a source area and a drain area of the semiconductor layer 612. The gate electrode 613 may be electrically connected to a scan line SL by at least one connection electrode. As a connection electrode on the third insulating layer 53 contacting the gate electrode 613 via a contact hole and a connection electrode on the fourth insulating layer 54 contacting the scan line SL via a contact hole contact each other via a contact hole, the connection electrodes may be electrically connected to each other.

The third insulating layer 53 may be arranged on the gate electrode 613, and the first electrode 614 and the second electrode 615 may be arranged on the third insulating layer 53. A fourth insulating layer 54 may be arranged on the first electrode 614 and the second electrode 615. The first electrode 614 may contact and be electrically connected to one of a source area and a drain area of the semiconductor layer 612 via a contact hole, and the second electrode 615 may contact and be electrically connected to the other of the source area and the drain area of the semiconductor layer 612 via a contact hole. The first electrode 614 may contact and be electrically connected to the data line DL via a contact hole. The second electrode 615 may be electrically connected to a first electrode 701 of the capacitor Cst via a contact hole.

The third transistor M3 may include a gate electrode 623, a semiconductor layer 622, a first electrode 624, and a second electrode 625. The second insulating layer 52 may be arranged between the semiconductor layer 622 and the gate electrode 623. The gate electrode 623 may be disposed to correspond to a channel area between a source area and a drain area of the semiconductor layer 622. The semiconductor layer 622 of the third transistor M3 may extend from the semiconductor layer 612 of the second transistor M2 to be unitary therewith. The gate electrode 623 may be connected to the control line CL by at least one connection electrode. As a connection electrode on the third insulating layer 53 contacting the gate electrode 623 via a contact hole and a connection electrode on the fourth insulating layer 54 contacting the control line CL via a contact hole contact each other via a contact hole, the connection electrodes may be electrically connected to each other.

The third insulating layer 53 may be arranged on the gate electrode 623, and the first electrode 624 and the second electrode 625 may be arranged on the third insulating layer 53. The fourth insulating layer 54 may be arranged on the first electrode 624 and the second electrode 625. The first electrode 624 may contact and be electrically connected to one of the source area and the drain area of the semiconductor layer 622 via a contact hole, and the second electrode 625 may contact and be electrically connected to the other of the source area and the drain area of the semiconductor layer 622 via a contact hole. The first electrode 624 of the third transistor M3 may be unitary with the second electrode 605 of the first transistor M1. That is, the first electrode 624 of the third transistor M3 may contact and be electrically connected to one of the source area and the drain area of the semiconductor layer 622 through the contact hole CNT2. The second electrode 625 may contact a connection electrode CE2 via a contact hole, and the connection electrode CE2 may contact and be electrically connected to a connection line CSENL contacting the sensing line SENL via a contact hole. Accordingly, the second electrode 625 may be electrically connected to the sensing line SENL. The connection line CSENL may extend in the second direction on the second insulating layer 52, and the connection electrode CE2 may extend in the first direction on the fourth insulating layer 54 and cross the control line CL.

The scan line SL and the control line CL may extend on the second insulating layer 52 in the second direction. The 1-1 power line VDL1 and the 2-1 power line VSL1 may extend on the fourth insulating layer 54 in the first direction. The 1-2 power line VDL2 and the 2-2 power line VSL2 may extend on the third insulating layer 53 in the second direction. The 1-2 power line VDL2 and the 2-2 power line VSL2 may be alternately arranged in units of rows. The 2-1 power line VSL1 and the 2-2 power line VSL2 may be electrically connected via a contact hole CNT4. Although not illustrated in the drawing, the 1-1 power line VDL1 and the 1-2 power line VDL2 of adjacent rows may be electrically connected via a contact hole. The 2-1 power line VSL1 may have a width, taken along a direction perpendicular to an extension direction thereof, and an area greater than those of the 1-1 power line VDL1. The 2-2 power line VSL2 may have a width, taken along a direction perpendicular to an extension direction thereof, and an area greater than those of the 1-2 power line VDL2.

The capacitor Cst may include a first electrode 701 and a second electrode 702. The first electrode 701 may be arranged on the second insulating layer 52, and the second electrode 702 may cover the first electrode 701 and be arranged on the third insulating layer 53. A portion extended from a portion of the first electrode 701 may function as the second gate electrode 603 of the first transistor M1, and a portion extended from another portion of the first electrode 701 may be electrically connected to the second electrode 615 of the second transistor M2. A portion extended from an end of the second electrode 702 may function as the second electrode 605 of the first transistor M1, and a portion extended from another end of the second electrode 702 may be electrically connected to a connection electrode CE3 via a contact hole CNT6.

A fifth insulating layer 55 may be arranged on the 1-1 power line VDL1 and the 2-1 power line VSL1. A pixel electrode 801 may be arranged on the fifth insulating layer 55. The pixel electrode 801 may be electrically connected to the connection electrode CE3 via a contact hole CNT7. Accordingly, the first gate electrode 601 of the first transistor M1 may receive a voltage applied to the pixel electrode 801.

A sixth insulating layer 56 covering edges of the pixel electrode 801 may be arranged on the fifth insulating layer 55. An intermediate layer 802 including an emissive layer may be arranged on the pixel electrode 801. An opposite electrode 803 facing the pixel electrode 801 may be arranged on the intermediate layer 802. The opposite electrode 803 may contact and be electrically connected to the 2-1 power line VSL1 through a contact hole CNT8. The organic light-emitting diode OLED may be a front-side light-emitting device.

A pad unit PAD1 may be included in a non-display area around a display area, and a pad electrode 901 on the fourth insulating layer 54 may be included in the pad unit PAD1. The fifth insulating layer 55 and the sixth insulating layer 56 on the pad electrode 901 may be removed, and a portion of the pad electrode 901 may be exposed to the outside accordingly.

The first insulating layer 51 through the sixth insulating layer 56 may be provided as a single layer or a multilayer including an inorganic material and/or an organic material.

While the second insulating layer 52 is disposed on the entire surface of the substrate 50 in FIG. 4B, as illustrated in FIG. 4C, the second insulating layer 52 may have a substantially equal width to those of the gate electrodes 603, 613, and 623 and that of the first electrode 701 of the capacitor Cst. In an exemplary embodiment, the second insulating layer 52 may be provided in a same mask operation as the gate electrodes 603, 613, and 623 and the first electrode 701 of the capacitor Cst, and thus, a lateral surface of the second insulating layer 52 may correspond to lateral surfaces of the gate electrodes 603, 613, and 623 and a lateral surface of the first electrode 701 of the capacitor Cst and may be arranged in a same plane as the lateral surfaces of the gate electrodes 603, 613, and 623 and the lateral surface of the first electrode 701 of the capacitor Cst, for example.

FIG. 4D illustrates a first sub-pixel SPX11, a second sub-pixel SPX12, a third sub-pixel SPX13 which constitute a unit pixel PX1 and arrangement of wirings. The first through third sub-pixels SPX11 through SPX13 may be arranged adjacent to one another in a same row. The first sub-pixel SPX11 may be arranged in a first column, the second sub-pixel SPX12 may be arranged in a second column, and the third sub-pixel SPX13 may be arranged in a third column. The first sub-pixel SPX11 may be a pixel emitting light of a first color. The second sub-pixel SPX12 may be a pixel emitting light of a second color. The third sub-pixel SPX13 may be a pixel emitting light of a third color. In an exemplary embodiment, the first sub-pixel SPX11 may be a red color pixel, the second sub-pixel SPX12 may be a green color pixel, and the third sub-pixel SPX13 may be a blue color pixel, for example. However, the invention is not limited thereto, and the unit pixel PX1 may include one or more sub-pixels that emit light of different colors.

Referring to FIG. 4D, in each unit pixel PX1, the 2-1 power line VSL1 may extend on the left of the pixel PX1 in the first direction, and the sensing line SENL may extend on the right of the pixel PX1 in the first direction. The 1-1 power line VDL1 may extend on the left of each of the first through third sub-pixels SPX11 through SPX13 in the first direction, and the data line DL may extend on the right of each of the first through third sub-pixels SPX11 through SPX13 in the first direction. The 2-1 power line VSL1 may be arranged in an outer portion with respect to the 1-1 power line VDL1 arranged on the left of the first sub-pixel SPX11. The sensing line SENL may be arranged in an outer portion with respect to the data line DL arranged on the right of the third sub-pixel SPX13. The sensing line SENL may be electrically connected to the connection line CSENL extending in the second direction. The connection line CSENL may be electrically connected to the second electrode of the third transistor M3 of each of the first through third sub-pixels SPX11 through SPX13, by the connection electrode CE2 (FIG. 4A). In the pixel PX1, one of the 1-2 power line VDL2 and the 2-2 power line VSL2 may extend in the second direction. That is, the first through third sub-pixels SPX11 through SPX13 may be connected to the 1-2 power line VDL2 or the 2-2 power line VSL2. In the exemplary embodiment of FIG. 4D, the pixel PX1 of a first row is connected to the 2-2 power line VSL2, and the pixel PX1 of a second row is connected to the 1-2 power line VDL2.

Each of the first through third sub-pixels SPX11 through SPX13 may be connected to a same scan line SL and a same control line CL. The scan line SL may extend in the second direction and arranged over the first through third sub-pixels SPX11 through SPX13. The scan line SL may be electrically connected to the gate electrode of the second transistor M2 of each of the first through third sub-pixels SPX11 through SPX13, by at least one connection electrode. The control line CL may extend in the second direction, and arranged below the first through third sub-pixels SPX11 through SPX13. The control line CL may be electrically connected to the gate electrode of the third transistor M3 of each of the first through third sub-pixels SPX11 through SPX13, by at least one connection electrode.

A capacity (size) of the capacitor Cst of each of the first through third sub-pixels SPX11 through SPX13 may be different from one another. By differentiating areas of the first electrode 701 of the capacitor Cst of the first through third sub-pixels SPX11 through SPX13, an overlapping area with respect to the second electrode 702 covering the first electrode 701 may be differentiated, thereby differing a capacity of the capacitor Cst. The capacity of the capacitor Cst may be determined in consideration of light-emitting characteristics of sub-pixels.

Figure 5A:
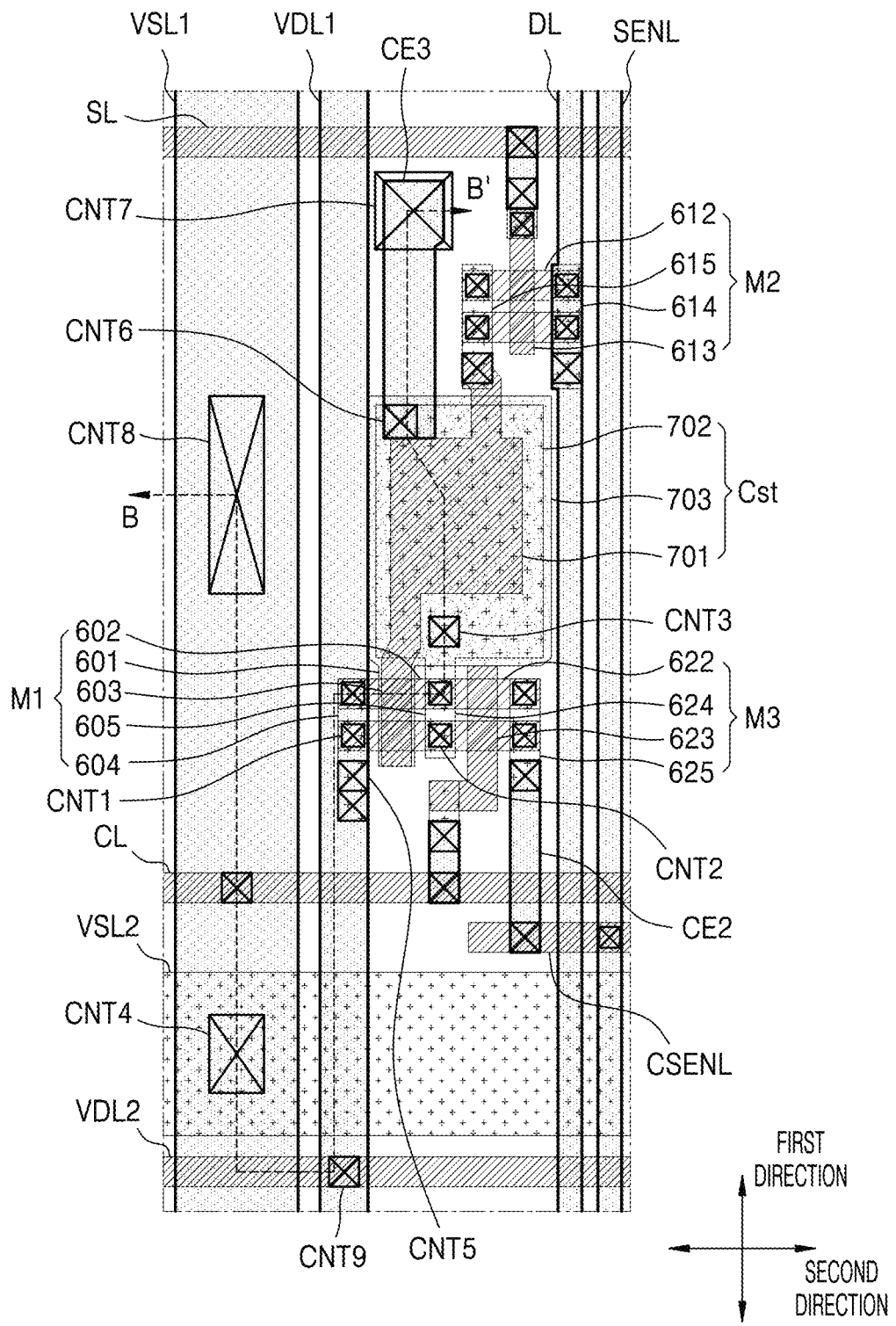
FIG. 5A is a plan view of an exemplary embodiment of a pixel illustrated in FIG. 3B.
Figure 5B:
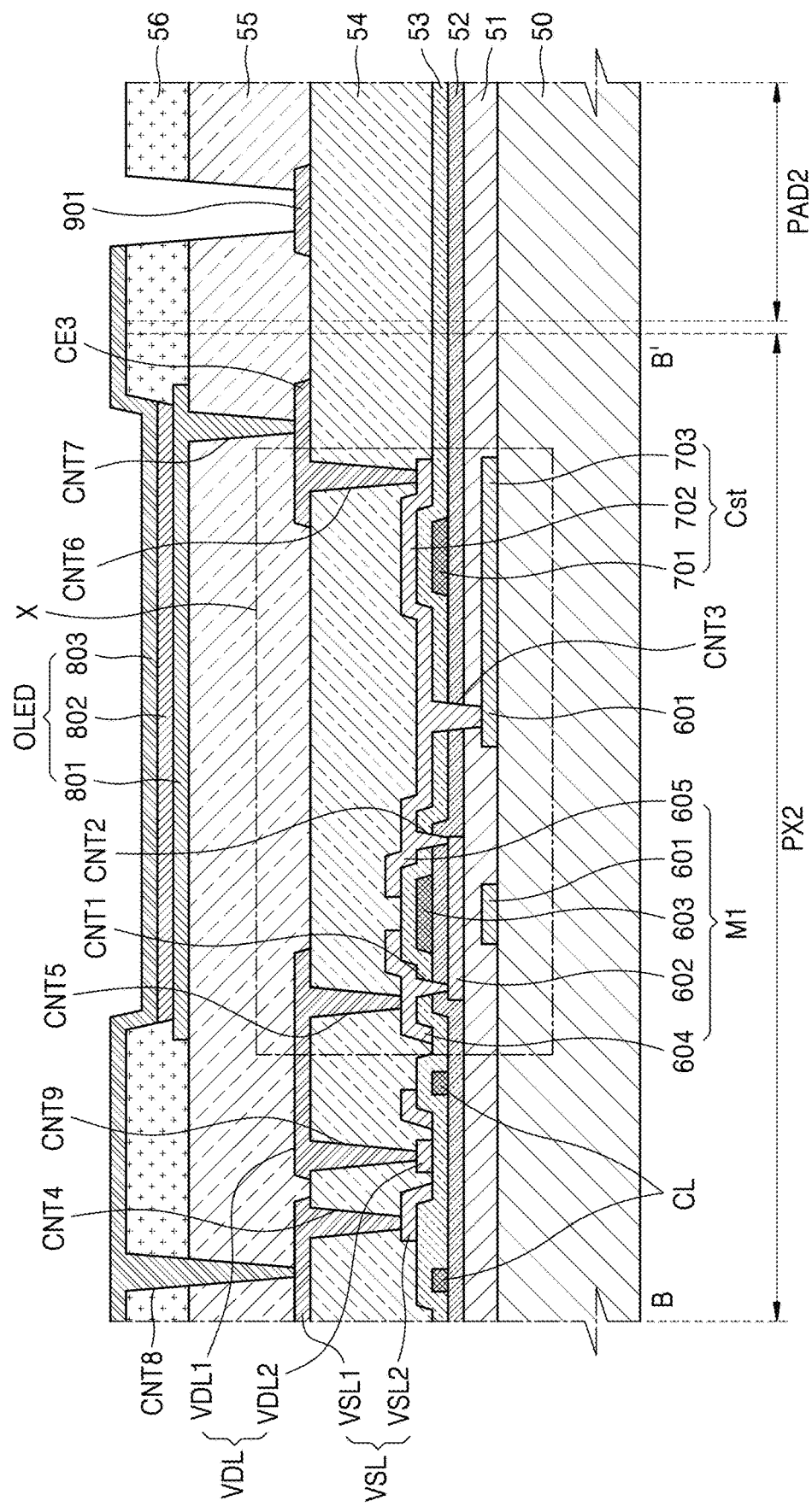
FIG. 5B is a cross-sectional view taken along line B-B' of FIG. 5A.
Figure 5C:
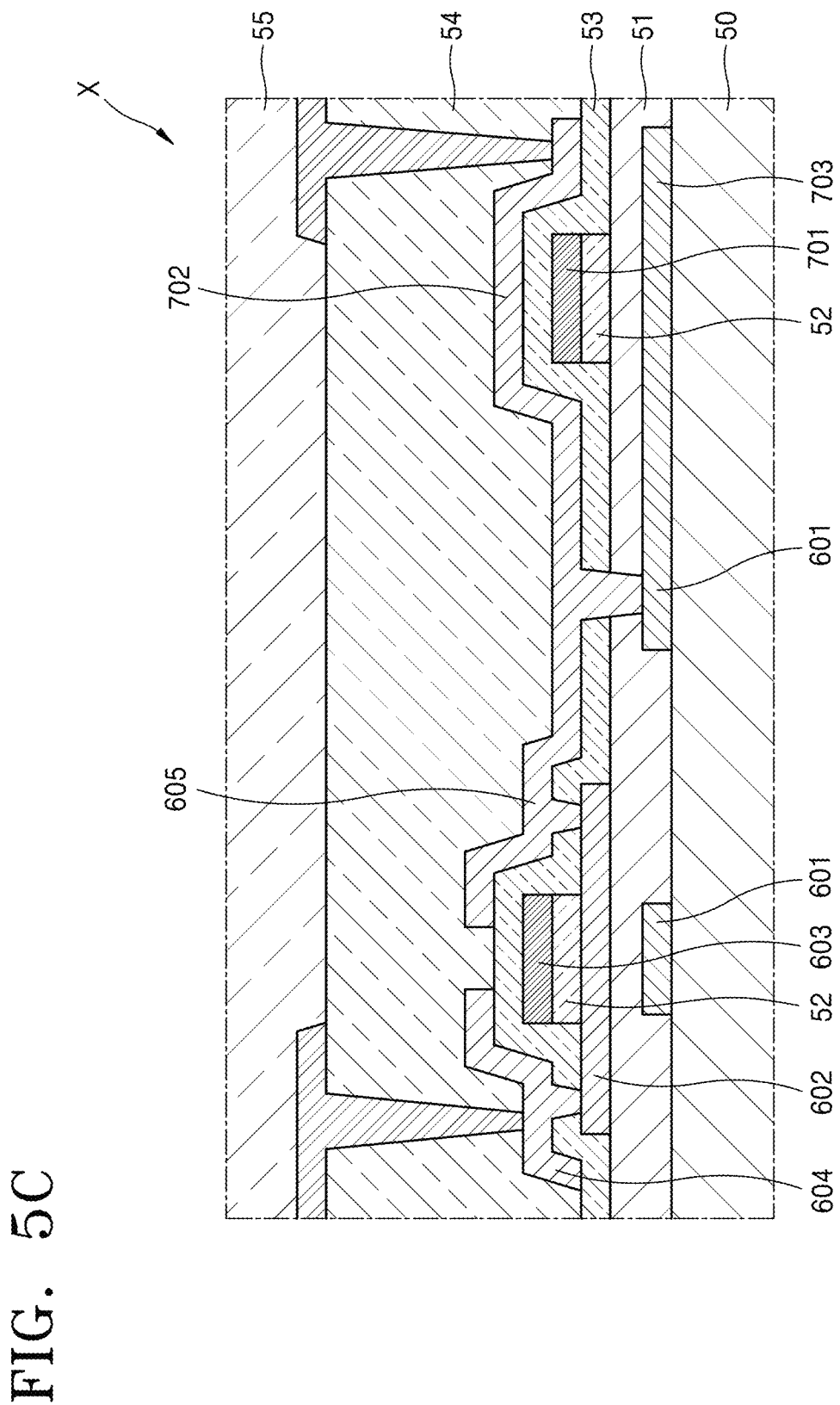
FIG. 5C is a cross-sectional view of portion X of FIG. 5B.
Figure 5D:
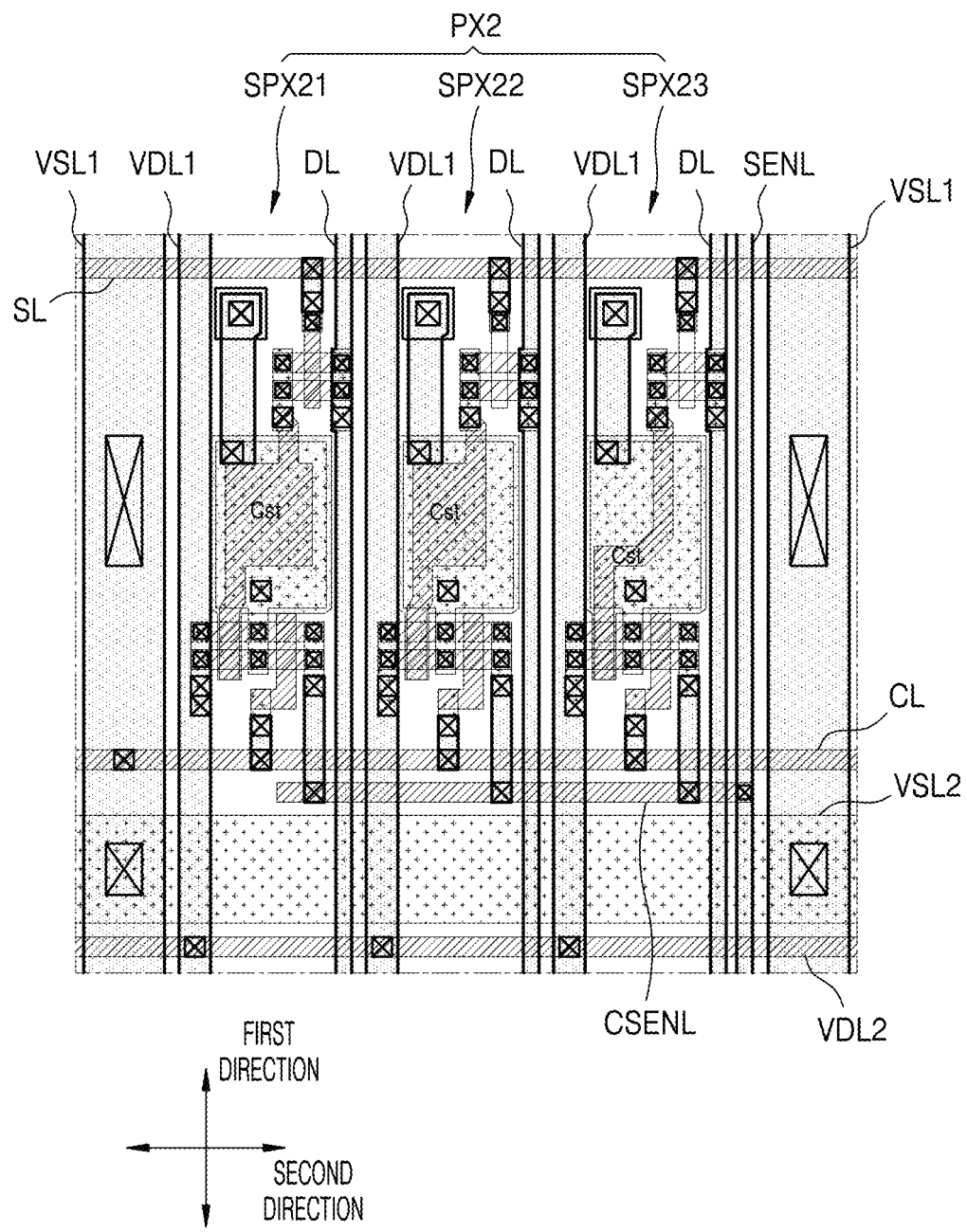
FIG. 5D is a plan view illustrating an exemplary embodiment of an arrangement of a unit pixel.

FIG. 5A is a plan view of an exemplary embodiment of a pixel PX2 illustrated in FIG. 3B. FIG. 5B is a cross-sectional view of the pixel PX2 taken along line B-B' of FIG. 5A. FIG. 5C is a cross-sectional view of a portion X of the pixel PX2 of FIG. 5B. FIG. 5D is a plan view illustrating an arrangement of a unit pixel. In FIG. 5B, a pad electrode 901 of a pad unit PAD is also illustrated. The pixel PX2 illustrated in FIG. 5A has an identical structure to that of the pixel PX1 illustrated in FIG. 4A except for a structure of a capacitor Cst and arrangement of power lines. Hereinafter, the description will focus on the difference from the exemplary embodiments of FIGS. 4A through 4D.

Referring to FIGS. 5A and 5B, the exemplary embodiment of the pixel PX2 may include a pixel circuit including the first through third transistors M1 through M3 and a capacitor Cst, and an organic light-emitting diode OLED, provided on the substrate 50. A conductive layer may be arranged on the substrate 50, and a portion of the conductive layer may function as a bottom gate electrode of the first transistor M1, and another portion of the conductive layer may function as an electrode of the capacitor Cst.

The first through third transistors M1 through M3 may each have a structure in which two transistors are connected in parallel. The capacitor Cst may have a structure in which two capacitors are connected in parallel. The first transistor M1 may be a double-gate transistor.

The capacitor Cst may include a first electrode 701, a second electrode 702, and a third electrode 703. The first insulating layer 51 and the second insulating layer 52 may be arranged between the third electrode 703 and the first electrode 701, and the third insulating layer 53 may be arranged between the first electrode 701 and the second electrode 702. The third electrode 703 may be arranged on the substrate 50, and the first electrode 701 may cover the third electrode 703 and be arranged on the second insulating layer 52, and the second electrode 702 may cover the first electrode 701 and be arranged on the third insulating layer 53. A portion extended from a portion of the first electrode 701 may function as the second gate electrode 603 of the first transistor M1, and a portion extended from another portion of the first electrode 701 may be electrically connected to the second electrode 615 of the second transistor M2. A portion extended from an end of the second electrode 702 may function as the second electrode 605 of the first transistor M1, and a portion extended from another end of the second electrode 702 may be electrically connected to the connection electrode CE3. A portion extended from the third electrode 703 may function as the first gate electrode 601 of the first transistor M1. The third electrode 703 may be electrically connected to the second electrode 702 via a contact hole CNT3. Accordingly, the first gate electrode 601 of the first transistor M1 and the third electrode 703 of the capacitor Cst may receive a voltage applied to the pixel electrode 801.

The 1-2 power line VDL2 and the 2-2 power line VSL2 may be arranged in each row. The 2-1 power line VSL1 and the 2-2 power line VSL2 may be electrically connected via a contact hole CNT4. The 1-1 power line VDL1 and the 1-2 power line VDL2 may be electrically connected via a contact hole CNT9. The 2-1 power line VSL1 may have a width, taken along a direction perpendicular to an extension direction thereof, and an area greater than those of the 1-1 power line VDL1. The 2-2 power line VSL2 may have a width, taken along a direction perpendicular to an extension direction thereof, and an area greater than those of the 1-2 power line VDL2.

A pad electrode 901 may be included on the fourth insulating layer 54 in the pad unit PAD2 of a non-display area. The fifth insulating layer 55 and the sixth insulating layer 56 on the pad electrode 901 may be removed, and a portion of the pad electrode 901 may be exposed to the outside accordingly.

In the pixel PX2 illustrated in FIG. 5A, a sufficient capacitor capacity may be provided with a smaller area than that of the pixel PX1 illustrated in FIG. 4A, and thus, the 2-2 power line VSL2 of the second power line VSL may be arranged in each row, thereby preventing voltage drop of the second power voltage ELVSS.

While the second insulating layer 52 disposed on the entire surface of the substrate 50 is illustrated in FIG. 5B, as illustrated in FIG. 5C, the second insulating layer 52 may have a substantially equal width to those of the gate electrodes 603, 613, and 623 and a substantially equal width to that of the first electrode 701 of the capacitor Cst.

FIG. 5D illustrates a first sub-pixel SPX21, a second sub-pixel SPX22, a third sub-pixel SPX23 which constitute a unit pixel PX2 and arrangement of wirings. Referring to FIG. 5D, in the capacitor Cst of each of the first through third sub-pixels SPX21 through SPX23, a capacitor provided by the third electrode 703 and the first electrode 701 and a capacitor provided by the first electrode 701 and the second electrode 702 are connected in parallel, and accordingly, a higher capacity may be provided with a smaller area than the capacitor Cst illustrated in FIG. 4A. Accordingly, space for arrangement of all of the 1-2 power line VDL2 and the 2-2 power line VSL2 may be ensured in each row. A capacity (size) of the capacitor Cst of each of the first through third sub-pixels SPX21 through SPX23 may be different.

In each pixel PX2, the 1-2 power line VDL2 and the 2-2 power line VSL2 may extend in the second direction. That is, the first through third sub-pixels SPX21 through SPX23 may be connected to the 1-2 power line VDL2 and the 2-2 power line VSL2. The 1-2 power line VDL2 may be arranged in an outer portion with respect to the 2-2 power line VSL2.

Figure 6A:
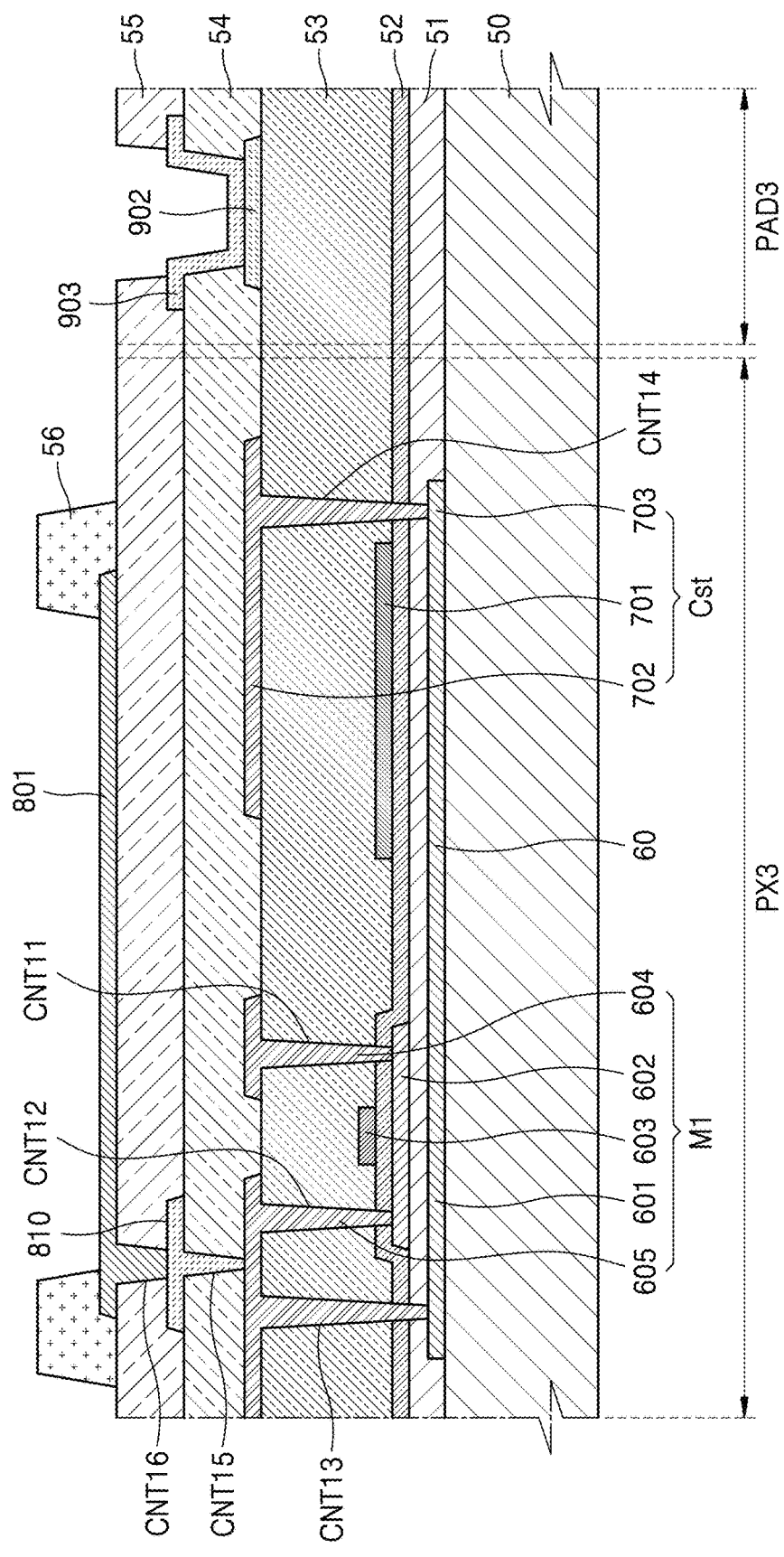
FIGS. 6A and 6B are cross-sectional views of another exemplary embodiment of a pixel.
Figure 6B:
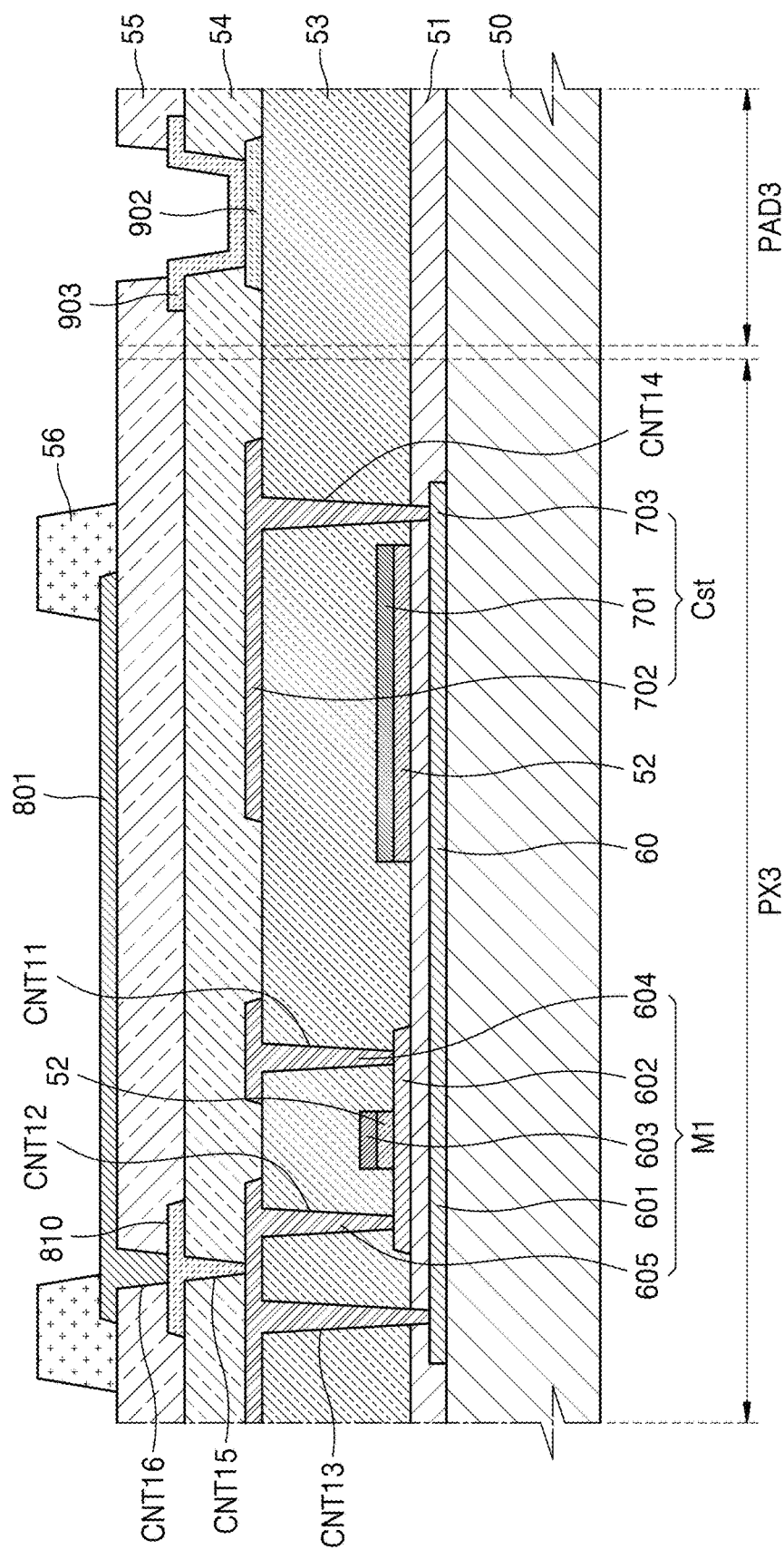

FIGS. 6A and 6B are cross-sectional views of another exemplary embodiment of a pixel PX3.

FIG. 6A illustrates only a first transistor M1 and a capacitor Cst of the pixel PX3.

A conductive layer 60 may be arranged on the substrate 50, and a first insulating layer 51 may be arranged on the conductive layer 60. A portion of the conductive layer 60 may function as a first gate electrode 601 of the first transistor M1, and another portion of the conductive layer 60 may function as a third electrode 703 of the capacitor Cst.

A semiconductor layer 602 of the first transistor M1 may be arranged on the first insulating layer 51. A second insulating layer 52 may be arranged on the semiconductor layer 602. The second gate electrode 603 of the first transistor M1 and the first electrode 701 of the capacitor Cst may be arranged on the second insulating layer 52. A third insulating layer 53 may be arranged on the second gate electrode 603 of the first transistor M1 and the first electrode 701 of the capacitor Cst. A first electrode 604 and a second electrode 605 of the first transistor M1 and a second electrode 702 of the capacitor Cst may be arranged on the third insulating layer 53. The first electrode 604 of the first transistor M1 may contact and be electrically connected to one of a source area and a drain area of the semiconductor layer 602 via a contact hole CNT11. The second electrode 605 of the first transistor M1 may contact and be electrically connected to one of the source area and the drain area of the semiconductor layer 602 via a contact hole CNT12. The second electrode 605 of the first transistor M1 may contact and be electrically connected to the conductive layer 60 via a contact hole CNT13. The second electrode 605 of the first transistor M1 may function as a connection electrode connecting, to the conductive layer 60, one of the source area and the drain area of the semiconductor layer 602 arranged in different layers. The second electrode 702 of the capacitor Cst may contact and be electrically connected to the conductive layer 60 via a contact hole CNT14. A fourth insulating layer 54 may be arranged on the first electrode 604 and the second electrode 605 of the first transistor M1 and the second electrode 702 of the capacitor Cst. A protection electrode 810 that is electrically connected to the second electrode 605 of the first transistor M1 via a contact hole CNT15 may be arranged on the fourth insulating layer 54. The protection electrode 810 may prevent damage due to exposure of the second electrode 605 of the first transistor M1 when forming the pixel electrode 801.

A fifth insulating layer 55 may be arranged on the protection electrode 810. A pixel electrode 801 may be arranged on the fifth insulating layer 55. As the pixel electrode 801 is electrically connected to the protection electrode 810 via a contact hole CNT16, the pixel electrode 801 may be electrically connected to the second electrode 605 of the first transistor M1 and the conductive layer 60. That is, the first gate electrode 601 of the first transistor M1 and the second electrode 702 of the capacitor Cst may receive a voltage that is identical to a voltage applied to the pixel electrode 801. In an exemplary embodiment, the protection electrode 810 may include a transparent material such as an indium-tine-oxide ("ITO"), indium-zinc-oxide ("IZO") or the like.

A first pad electrode 902 and a second pad electrode 903 may be arranged in a pad unit PAD3 of a non-display area. The first pad electrode 902 may be arranged on the third insulating layer 53. The second pad electrode 903 may contact the first pad electrode 902 in a portion where the fourth insulating layer 54 on the first pad electrode 902 is removed, to be electrically connected to the first pad electrode 902. The second pad electrode 903 may prevent corrosion due to exposure of the first pad electrode 902 to the outside. In an exemplary embodiment, the second pad electrode 903 may include a transparent material such as ITO, IZO or the like.

In FIG. 6B, unlike FIG. 6A where the second insulating layer 52 is disposed on the entire surface of the substrate 50, the second insulating layer 52 has a width that is substantially equal to those of the gate electrodes 603, 613, and 623 (referring to FIGS. 4A to 5D) and that of the first electrode 701 of the capacitor Cst. In an exemplary embodiment, the second insulating layer 52 may be provided in a same mask operation as that of the second gate electrode 603 of the first transistor M1 and the first electrode 701 of the capacitor Cst, and thus, a lateral surface of the second insulating layer 52 may correspond to a lateral surface of the second gate electrode 603 of the first transistor M1 and a lateral surface of the first electrode 701 of the capacitor Cst and may be arranged in a same plane as the lateral surface of the second gate electrode 603 and the lateral surface of the first electrode 701, for example.

Although not illustrated in the drawing, the semiconductor layers, gate electrodes, first electrodes, and the second electrodes that constitute the second transistor M2 and the third transistor M3 may include a same material as that of semiconductor layer, second gate electrode, first electrode, and second electrode of the first transistor M1 respectively and may be disposed in a same layer as those layers in which the semiconductor layer, second gate electrode, first electrode, and second electrode of the first transistor M1 are respectively disposed.

A sixth insulating layer 56 covering edges of the pixel electrode 801 may be arranged on the fifth insulating layer 55. An intermediate layer including an emissive layer and an opposite electrode facing the pixel electrode 801 on the intermediate layer may be arranged on the pixel electrode 801.

Although it is not illustrated in FIGS. 6A and 6B, the 1-1 power line VDL1, the 1-2 power line VDL2, the 2-1 power line VSL1 and the 2-2 power line VSL2 may be understood with referring to FIGS. 4A to 5D. The 1-2 power line VDL2 and the 2-2 power line VSL2 may be arranged on the second insulating layer 52, that is, in a same layer as the second gate electrode 603. The 1-1 power line VDL1 and the 2-1 power line VSL1 may be arranged on the third insulating layer 53, that is, in a same layer as the first electrode 604 and the second electrode 605. The 1-2 power line VDL2 and the 2-2 power line VSL2 may be alternately arranged in units of rows. The 1-1 power line VDL1 and the 1-2 power line VDL2 may be electrically connected via a contact hole. The 2-1 power line VSL1 and the 2-2 power line VSL2 may be electrically connected via a contact hole. The opposite electrode may contact and be electrically connected to the 2-1 power line VSL1 connected to the pixel PX3. The 1-2 power line VDL2 and the 2-2 power line VSL2 may be arranged in each row.

Figure 7:
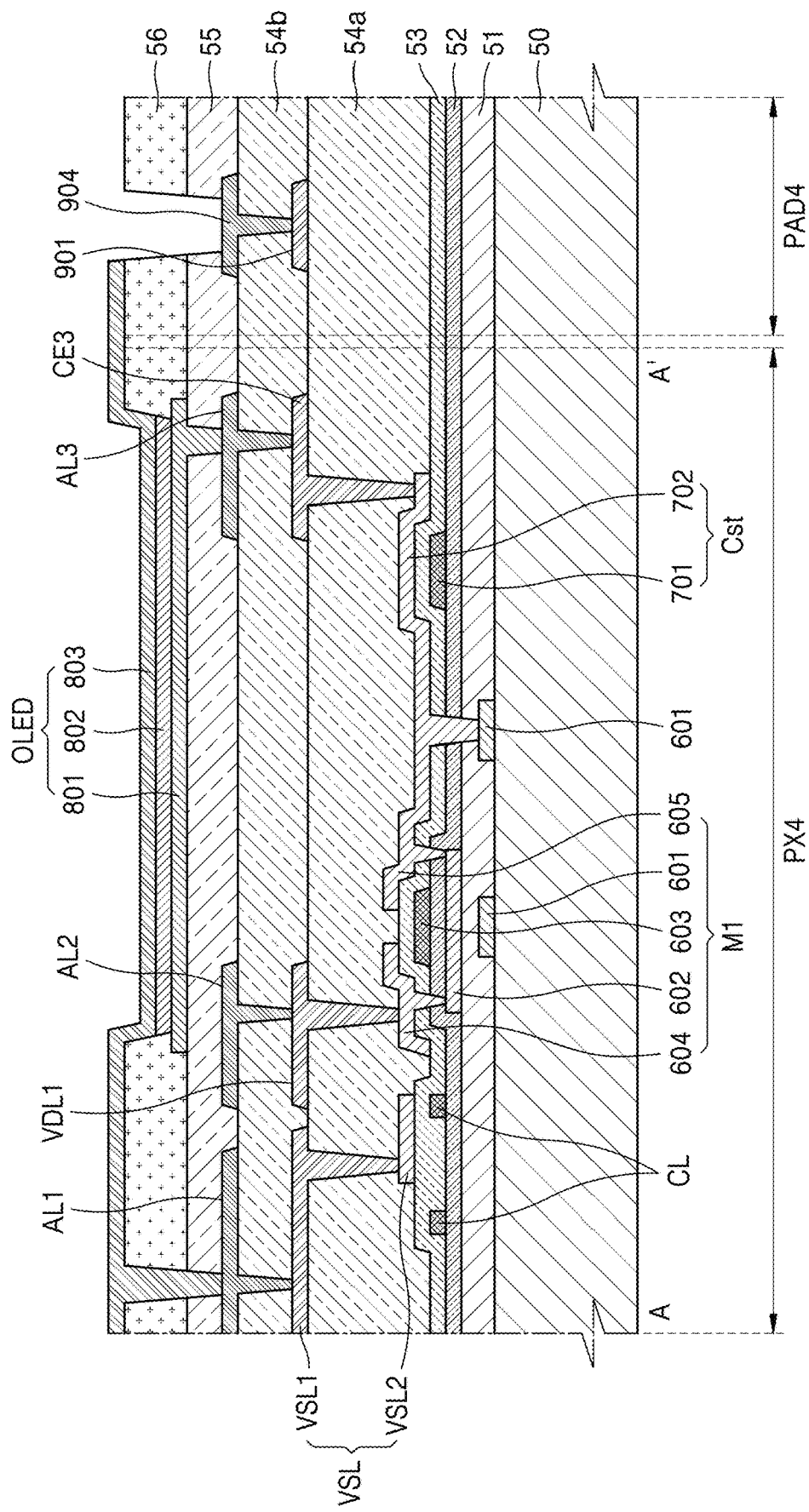
FIGS. 7 and 8 are cross-sectional views of other exemplary embodiments of a pixel.

FIG. 7 is a cross-sectional view of another exemplary embodiment of a pixel PX4.

The exemplary embodiment of FIG. 7 is different from the exemplary embodiment of FIG. 4B in that the 1-1 power line VDL1 and the 2-1 power line VSL1 have a double-layer structure. Hereinafter, description will focus on the difference from the exemplary embodiment of FIG. 4B, and description of the elements provided with respect to the exemplary embodiment of FIG. 4B will be omitted.

Referring to FIG. 7, a 4-1 insulating layer 54a may be arranged on the first electrode 604 and the second electrode 605 of the first transistor M1, the first electrode 614 and the second electrode 615 of the second transistor M2, and the first electrode 624 and the second electrode 625 of the third transistor M3, of the pixel PX4.

The 1-1 power line VDL1 and the 2-1 power line VSL1 and the connection electrode CE3 may be arranged on the 4-1 insulating layer 54a. A 4-2 insulating layer 54b may be arranged on the 1-1 power line VDL1 and the 2-1 power line VSL1, and the connection electrode CE3.

A first auxiliary line AL1 electrically connected to the 2-1 power line VSL1 via a contact hole, a second auxiliary line AL2 electrically connected to the 1-1 power line VDL1 via a contact hole, and a third auxiliary line AL3 electrically connected to the connection electrode CE3 via a contact hole may be arranged on the 4-2 insulating layer 54b. The first through third auxiliary lines AL1, AL2, and AL3 may reduce resistance of the 1-1 and 2-1 power lines VDL1 and VSL1 and the connection electrode CE3 therebelow, thereby minimizing voltage drop.

A fifth insulating layer 55 may be arranged on the first through third auxiliary lines AL1, AL2, and AL3, and a pixel electrode 801 may be arranged on the fifth insulating layer 55. As the pixel electrode 801 is electrically connected to the third auxiliary line AL3 via a contact hole, the pixel electrode 801 may be electrically connected to the connection electrode CE3 and the first gate electrode 601 of the first transistor M1. That is, the first gate electrode 601 of the first transistor M1 may receive a voltage identical to a voltage applied to the pixel electrode 801.

A first pad electrode 901 on the 4-1 insulating layer 54a and a second pad electrode 904 on the 4-2 insulating layer 54b may be provided in a pad unit PAD4. The second pad electrode 904 may contact and be electrically connected to the first pad electrode 901 via a contact hole of the 4-2 insulating layer 54b on the first pad electrode 901. The fifth insulating layer 55 and the sixth insulating layer 56 on the second pad electrode 904 may be removed, and a portion of the second pad electrode 904 may be exposed to the outside accordingly.

Figure 8:
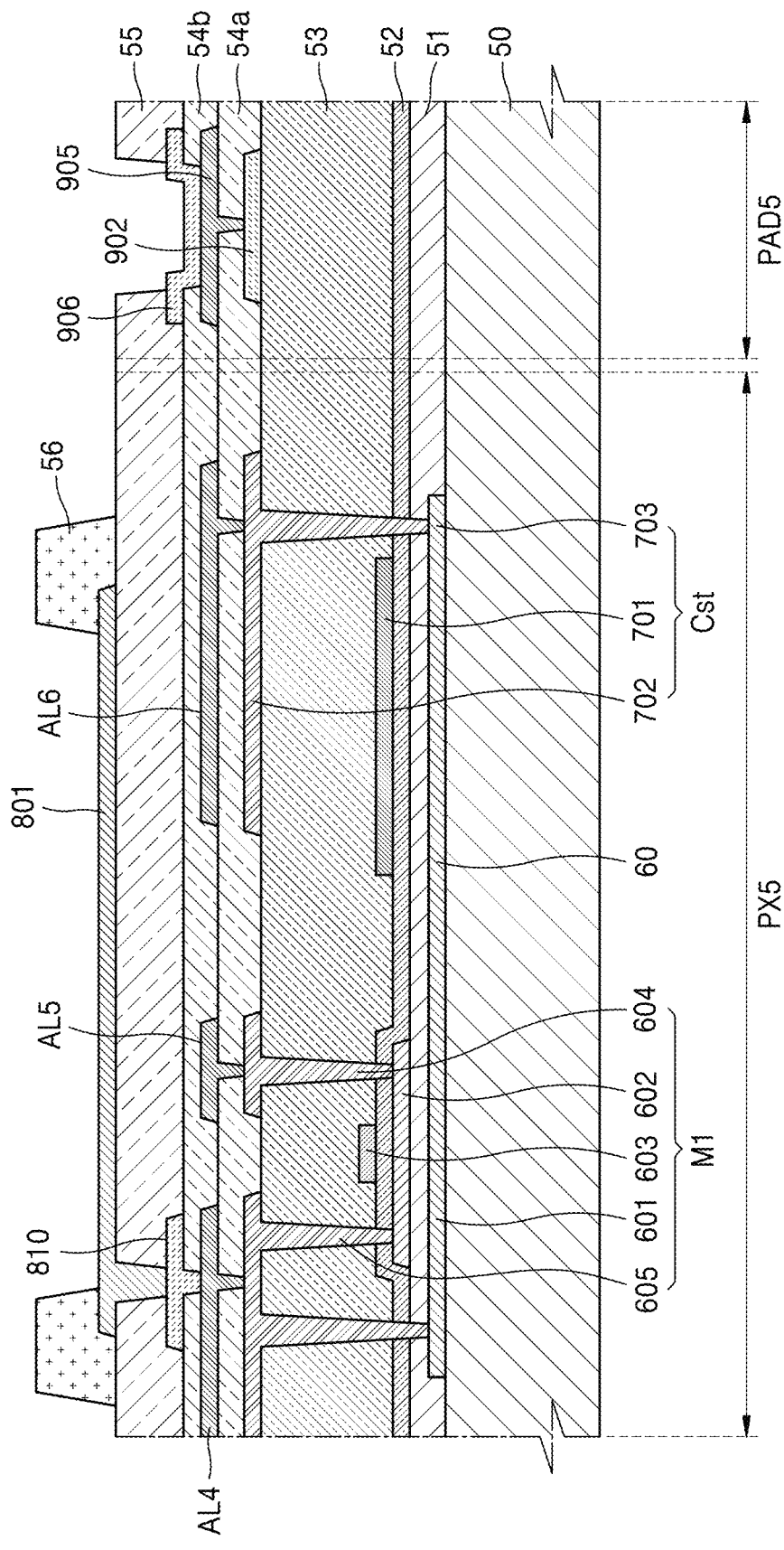

FIG. 8 is a cross-sectional view of another exemplary embodiment of a pixel PX5.

The exemplary embodiment of FIG. 8 is different from the exemplary embodiment of FIG. 6A in that the first electrode 604 and the second electrode 605 of first transistor M1 and the second electrode 702 of capacitor Cst have a double-layer structure. Hereinafter, description will focus on the difference from the exemplary embodiment of FIG. 6A, and description of the elements provided with respect to the exemplary embodiment of FIG. 6A will be omitted.

Referring to FIG. 8, the first electrode 604 and the second electrode 605 of the first transistor M1 and the second electrode 702 of the capacitor Cst may be arranged on the third insulating layer 53 of the pixel PX5. The first electrode 604 of the first transistor M1 may contact and be electrically connected to one of a source area and a drain area of the semiconductor layer 602 through a contact hole. The second electrode 605 of the first transistor M1 may contact and be electrically connected to the other of the source area and the drain area of the semiconductor layer 602 through a contact hole. The second electrode 605 of the first transistor M1 may contact the conductive layer 60 via a contact hole to be electrically connected to the conductive layer 60. The second electrode 605 of the first transistor M1 may function as a connection electrode connecting, to the conductive layer 60, one of the source area and the drain area of the semiconductor layer 602 arranged in different layers.

The second electrode 702 of the capacitor Cst may contact the conductive layer 60 via a contact hole to be electrically connected to the conductive layer 60. A 4-1 insulating layer 54*a* may be arranged on the first electrode 604 and the second electrode 605 of the first transistor M1 and the second electrode 702 of the capacitor Cst.

A fourth auxiliary line AL4 electrically connected to the second electrode 605 of the first transistor M1 via a contact hole, a fifth auxiliary line AL5 electrically connected to the first electrode 604 of the first transistor M1 via a contact hole, and a sixth auxiliary line AL6 electrically connected to the second electrode 702 of the capacitor Cst via a contact hole may be arranged on the 4-1 insulating layer 54*a*. The fourth through sixth auxiliary lines AL4, AL5, and AL6 may respectively reduce resistance of the second electrode 605, the first electrode 604, and the second electrode 702 which are respectively below the fourth through sixth auxiliary lines AL4, AL5, and AL6.

A 4-2 insulating layer 54*b* may be arranged on the fourth through sixth auxiliary lines AL4, AL5, and AL6, and the protection electrode 810 electrically connected to the fourth auxiliary line AL4 via a contact hole may be arranged on the 4-2 insulating layer 54*b*. The protection electrode 810 may prevent damage due to exposure of the fourth auxiliary line AL4 when forming the pixel electrode 801.

A fifth insulating layer 55 may be arranged on the protection electrode 810. The pixel electrode 801 may be arranged on the fifth insulating layer 55. As the pixel electrode 801 is electrically connected to the protection electrode 810 via a contact hole, the pixel electrode 801 may be electrically connected to the second electrode 605 of the first transistor M1 and the conductive layer 60. That is, the first gate electrode 601 of the first transistor M1 and the second electrode 702 of the capacitor Cst may receive a voltage that is identical to a voltage applied to the pixel electrode 801.

A portion of the conductive layer 60 may function as the first gate electrode 601 of the first transistor M1, and another portion of the conductive layer 60 may function as a third electrode 703 of the capacitor Cst.

In a pad unit PAD5, a first pad electrode 902 on the third insulating layer 53, a second pad electrode 905 on the 4-1 insulating layer 54*a*, and a third pad electrode 906 on the 4-2 insulating layer 54*b* may be included. The second pad electrode 905 may contact and be electrically connected to the first pad electrode 902 via a contact hole in the 4-1 insulating layer 54*a*. The third pad electrode 906 may contact and be electrically connected to the second pad electrode 905 in a portion where the 4-2 insulating layer 54*b* on the second pad electrode 905 is removed. The fifth insulating layer 55 and the sixth insulating layer 56 on the third pad electrode 906 may be removed, and a portion of the third pad electrode 906 may be exposed to the outside accordingly. The third pad electrode 906 may prevent corrosion due to exposure of the second pad electrode 905 to the outside.

In an exemplary embodiment, the protection electrode 810 and the third pad electrode 906 may include a transparent material such as ITO, IZO or the like.

In the exemplary embodiments of FIGS. 4A through 5D and 7, the 1-2 power line VDL2 and the 2-2 power line VSL2 are described as being disposed in a same layer and include a same material as that of the second electrode 702 of the capacitor Cst, but the 1-2 power line VDL2 and the 2-2 power line VSL2 may be disposed in a same layer and include a same material as that of the first electrode 701 or the third electrode 703 of the capacitor Cst. In an alternative exemplary embodiment, the 1-2 power line VDL2 and the 2-2 power line VSL2 may include a same material as that of the first electrode 701, the second electrode 702, and/or the third electrode 703 of the capacitor Cst as a double wiring or a triple wiring.

In the exemplary embodiments of FIGS. 6A, 6B, and 8, the 1-2 power line VDL2 and the 2-2 power line VSL2 are described as being disposed on the second insulating layer 52, that is, in a same layer and include a same material as that of the first electrode 701 of the capacitor Cst. The 1-2 power line VDL2 and the 2-2 power line VSL2 may be disposed in a same layer and include a same material as that of the second electrode 702 or the third electrode 703 of the capacitor Cst. In an alternative exemplary embodiment, the 1-2 power line VDL2 and the 2-2 power line VSL2 may include a same material as that of the first electrode 701, the second electrode 702, and/or the third electrode 703 of the capacitor Cst as a double wiring or a triple wiring.

In the exemplary embodiments of the invention, a driving transistor is implemented as a double-gate transistor, and as a source voltage of the driving transistor is applied to a lower gate electrode, transistor characteristics may be improved.

In addition, in the exemplary embodiments of the invention, by implementing a parallel structure of two capacitors that are arranged vertically, a large capacity may be ensured using a relatively small area. Accordingly, as a power line electrically connected to a cathode electrode of a light-emitting device may be arranged in each pixel, a voltage drop in a cathode voltage may be prevented.

In the exemplary embodiments of the invention, a double-gate transistor may be used to enhance transistor characteristics, and a sufficient capacitor capacity may be ensured with a relatively small area, thereby providing a display apparatus in which deterioration of image quality is prevented.

The exemplary embodiment of the display apparatus according to the invention may be applied to portable terminals such as a tablet personal computer ("PC"), a smartphone, a personal digital assistant ("PDA"), a portable multimedia player ("PMP"), a game player, a wristwatchtype electronic device. The display apparatus is not limited to portable terminals, and may be used in large-size electronic equipment such as a television or an outside advertisement board or small or medium-size electronic equipment such as a personal computer, a laptop computer, an automobile navigation unit, or a camera. The invention is not limited to the above-described examples, and may also be applied to other electronic equipment within the range of the invention.

It should be understood that embodiments described herein should be considered in a descriptive sense only and not for purposes of limitation. Descriptions of features within each exemplary embodiment should typically be considered as available for other similar features in other exemplary embodiments.

While one or more embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
    a first power line in a display area;
    a second power line in the display area; and
    a plurality of pixels in the display area,
    wherein each of the plurality of pixels comprises a first transistor and a light-emitting device,
    wherein the first transistor comprises a gate electrode, a semiconductor layer, a first electrode and a second electrode, the first electrode and the second electrode respectively electrically connected to a source area and a drain area of the semiconductor layer, and
    wherein the light-emitting device comprises:
    a pixel electrode connected to the one of the first electrode and the second electrode of the first transistor;
    an opposite electrode facing the pixel electrode; and
    an emissive layer between the pixel electrode and the opposite electrode, and
    wherein the first power line is electrically connected to first transistors of the plurality of pixels,
    wherein the opposite electrode faces pixel electrodes of the plurality of pixels,
    wherein the second power line is electrically connected to the opposite electrode,
    wherein the second power line electrically connected to the opposite electrode of the light-emitting device comprises a plurality of 2-1 power lines extending in a first direction and a plurality of 2-2 power lines extending in a second direction different from the first direction and electrically connected to the plurality of 2-1 power lines,
    wherein the 2-1 power lines and the 2-2 power lines are disposed in different layers in the display area, and
    wherein the first electrode and the second electrode of the first transistor and one of the 2-1 power lines and the 2-2 power lines are disposed in a same layer.

2. The display apparatus of claim 1, further comprising a conductive layer in the display area; and
    wherein the conductive layer is overlapped with the semiconductor layer of the first transistor and is electrically connected to the one of the first electrode and the second electrode of the first transistor.

3. The display apparatus of claim 2, wherein each of the plurality of pixels further comprises a capacitor comprising a first capacitor electrode, a second capacitor electrode above the first capacitor electrode, and a third capacitor electrode below the first capacitor electrode, and the one of the first electrode and the second electrode of the first transistor is electrically connected to the third capacitor electrode.

4. The display apparatus of claim 3, wherein the conductive layer and the third capacitor electrode of the capacitor are disposed in a same layer, and the gate electrode of the first transistor and the first capacitor electrode of the capacitor are disposed in a same layer, and the first electrode and the second electrode of the first transistor and the second capacitor electrode of the capacitor are disposed in a same layer.

5. The display apparatus of claim 2, wherein the conductive layer is between a substrate and the semiconductor layer of the first transistor.

6. The display apparatus of claim 1, wherein the first power line comprises a plurality of 1-1 power lines extending in the first direction and a plurality of 1-2 power lines extending in the second direction and electrically connected to the plurality of 1-1 power lines.

7. The display apparatus of claim 6, wherein one of the 1-2 power lines of the first power line and the 2-2 power lines of the second power line is disposed in each of a plurality of rows, wherein the 1-2 power line and the 2-2 power line are alternately disposed in the first direction.

8. The display apparatus of claim 6, wherein one of the 1-2 power lines of the first power line and one of the 2-2 power lines of the second power line are disposed in each of a plurality of rows.

9. The display apparatus of claim 6, further comprising a first auxiliary line overlapping the 1-1 power lines and electrically connected to the 1-1 power lines, and a second auxiliary line overlapping the 2-1 power lines and electrically connected to the 2-1 power lines.

10. The display apparatus of claim 9, further comprising a first pad electrode and a second pad electrode electrically connected to the first pad electrode in a non-display area, wherein the first pad electrode, the 1-1 power lines and the 2-1 power lines are disposed in a same layer, and wherein the second pad electrode, the first auxiliary line and the second auxiliary line are disposed in a same layer.

11. The display apparatus of claim 1, wherein the opposite electrode contacts the second power line around the light-emitting device in the display area.

12. The display apparatus of claim 1, wherein the semiconductor layer of the first transistor comprises oxide semiconductor.

13. The display apparatus of claim 1, wherein each of the plurality of pixels further comprises a capacitor comprising a first capacitor electrode and a second capacitor electrode above the first capacitor electrode.

14. The display apparatus of claim 13, further comprising a conductive layer in the display area; and
    wherein the conductive layer is overlapped with the semiconductor layer of the first transistor and is between a substrate and the first capacitor electrode of the capacitor.

15. The display apparatus of claim 1, wherein the one of the first electrode and the second electrode of the first transistor is electrically connected to a pixel electrode of the light-emitting device.

16. The display apparatus of claim 1, wherein each of the plurality of pixels further comprises a second transistor connected between the gate electrode of the first transistor and a data line extending in the first direction.

17. The display apparatus of claim 1, wherein each of the plurality of pixels further comprises a third transistor connected between the one of the first electrode and the second electrode of the first transistor and a sensing line.

18. The display apparatus of claim 1, further comprising a pad electrode in a non-display area.

* * * * *